(12) United States Patent
Chang et al.

(10) Patent No.: US 6,457,864 B1
(45) Date of Patent: Oct. 1, 2002

(54) OMNI-DIRECTIONAL HIGH PRECISION FRICTION DRIVE POSITIONING STAGE

(75) Inventors: Woo Sok Chang, Lexington, MA (US); Kamal Youcef-Toumi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/309,902

(22) Filed: May 11, 1999

Related U.S. Application Data
(60) Provisional application No. 60/085,481, filed on May 14, 1998.

(51) Int. Cl.[7] ................................................ F16C 23/00
(52) U.S. Cl. .............................. 384/9; 384/40; 384/91; 384/247; 384/519; 384/583
(58) Field of Search ................................ 384/9, 40, 91, 384/247, 519, 583

(56) References Cited

U.S. PATENT DOCUMENTS

| | | |
|---|---|---|
| 4,163,168 A | 7/1979 | Ishikawa et al. |
| 4,857,791 A | 8/1989 | Uchino et al. |
| 5,013,958 A | 5/1991 | Ohnishi et al. |
| 5,134,334 A | 7/1992 | Onishi et al. |
| 5,345,137 A | 9/1994 | Funakubo et al. |
| 5,416,375 A | 5/1995 | Funakubo et al. |
| 5,453,653 A | 9/1995 | Zumeris |
| 5,523,643 A | 6/1996 | Fujimura et al. |

OTHER PUBLICATIONS

"Piezoelectrically Driven XYΘ Table for Submicron Lithography Systems", Kazuyoshi Sugihara et al., Review of Scientific Instruments, vol. 60, No. 9;Sep. 1, 1989, pp. 3024–3029.

Patent Abstracts of Japan, vol. 018, No. 556 (E–1620), Oct. 24, 1994, Pub. No. 06204107, Canon Inc.

"Analysis of Plane Ultrasonic Piezoelectric Actuators", IEEE Industry Applications Magazine, Jul./Aug. 1995, pp. 23–29.

Henry O. Choi, "A Linear Ultrasonic Motor for Nano–Technology", submitted to the Dept. of Mechanical Engineering in Partial Fulfillment of the Requirements for the Degree of Master of Science in Mechanical Engineering at the Massachusetts Institute of Technology, May 1996, pp. 1–21.

Minoru Kurosawa et al., "Ultrasonic Linear Motor Using Surface Acoustic Waves", IEEE Transactions on Ultrasonics, Ferroelectrics and Frequency Control, vol. 43, No. 5, Sep. 1996, pp. 901–906.

Woo Sok Chang et al., "Modeling of an Omni–Directional High Precision Friction Drive Positioning Stage", Massachusetts Institute of Technology, Cambridge, Mass. (No date).

Koshi Adachi et al., "Transmission Systems of Motion and Force—Friction Drive/Traction Drive", Materials Science and Technology, in Japanese. (No date).

"The Micropositioning Book", Burleigh Instruments, Inc., Fishers, NY, pp. 1–13, (No date).

(List continued on next page.)

*Primary Examiner*—Lenard A. Footland
(74) *Attorney, Agent, or Firm*—Daly, Crowley & Mofford, LLP

(57) ABSTRACT

A high precision friction drive positioning stage system is described. The friction drive positioning stage system uses three special actuation systems, each having a tip in contact with the stage and being capable of generating directional elliptical motion which allows the stage to move in any direction in the plane of the stage and in rotation. In one embodiment, each actuation system includes a plurality of piezoelectric elements in contact with a hat-shaped element at which the tip of the actuation system is located.

15 Claims, 26 Drawing Sheets

OTHER PUBLICATIONS

Cai Hegao et al., "A New Force–Controlled Micro Robotic Worktable Driven by Piezoelectrical Elements", Proceedings of the IMACS/SICE International Symposium on Robotics, Mechatronics and Manufacturing Systems '92 Kobe, Japan, Sep. 16–20, 1992, pp. 637–642.

Kenji Mori et al., "Ultrasonic Linear Motor For A High Precision X–Y Stage", 1989 IEEE Ultrasonics Symposium, pp. 657–660.

Tetsuo Ohara, "A New High Precision Position Measurement System", Massachusetts Institute of Technology, May 1995, pp. 1–9.

Paul I. Ro, et al., "Nanometric Motion Control of a Traction Drive", DSC–vol. 55–2, Dynamic Systems and Control: vol. 2 ASME 1994, pp. 879–883. (No date).

Shigeru Sakuta et al., "Precision Table Control System by Friction Drive for Optical Disk Mastering Machine", Japanese article w/English abstract (No date).

S. Ueha, "Frictional Material information", pp. 289–293. (No date).

Junichi Toyoda et al., "A Small–Size Ultrasonic Linear Motor", Japanese Journal of Applied Physics, vol. 30, No. 9B, Sep., 1991, pp. 2274–2276.

Minoru Kurosawa et al., "Hybrid Transducer Type Ultrasonic Motor", IEEE Transactions on Ultrasonics, Ferroelectrics and Frequency Control, vol. 38, No. 2, Mar. 1991, pp. 89–92.

Japanese article w/o translation, Nikkei Mechanical, May 26, 1997, No. 507, pp. 74–79.

Antoine Ferreira et al., "New Multi–degree of Freedom Piezoelectric Micromotors for Micromanipulator Applications", 1995 IEEE Ultrasonics Symposium, pp. 417–422.

% diff eqn for the simulation of 3DOF stage motion

```
function xdot=d77 (t, x)
global freq omega theta_d1 theta_d2 theta_d3 ms l ma cm N g fp kz0 bs bi ba
global myu delta r ra rp v01 v02 v03 vr
global j11 j12 j13 j21 j22 j23 j31 j32 j33 bx by bz
global a1 b1 a2 b2 a3 b3
global e11 e21 e31 e12 e22 e32 e13 e23 e33 omega=2*pi* freq;
e11=v01*sin (omega*t) +cos (theta_d1) *vr*v01*cos (omeqa*t)*r/rp;
e21=v01*sin (omega*t)- cos (pi/3+theta_d1) *vr*v01*cos (omega*t) *r/rp;
e31=v01*sin (omega*t) -cos (pi/3-theta_d1) *vr*v01*cos (omega*t)*r/rp;
e12=v02*sin (omega*t) +cos (theta_d2)*vr*v02*cos (omega*t) *r/rp;
e22=v02*sin (omega*t) -cos (pi/3+theta_d2) *vr*v02*cos (omega*t)*r/rp;
e32=v02*sin (omega*t) -cos (pi/3-theta_ d2) *vr*v02*cos (omega*t)*r/rp;
e13=v03*sin (omega*t) +cos. (theta_d3) *vr*v03*cos (omega*t) *r/rp;
e23=v03*sin (omega*t) -cos (pi/3+theta_d3) *vr*v03*cos (omega*t)*r/rp;
e33=v03*sin (omega*t) -cos (pi/3-theta_d3) *vr*v03*cos (omega*t) *r/rp;
vax1=j11*x (7)+j12*x (8) +j13*x (9) ;
vay1=j21*x (7)+j22*x (8) +j23*x (9) ;
vaz1=j31*x (7)+j32*x (8)+ j33*x (9);
vax2=j11*x (10)+j12*x (11)+j13*x (12);
vay2=j21*x (10)+j22*x (11)+j23*x (12);
vaz2=j31*x (10)+j32*x (11)+j33*x (12);
vax3=j11*x (13) + j12*x (14) +j13*x (15);
vay3=j21*x (13) + j22*x (14) +j23*x (15);
vaz3=j31*x (13) + j32*x (14) + j33*x (15);
za1=j31*x (25) + j32*x (26) + j33*x (27);
za2=j31*x (28) + j32*x (29) +j33*x (30);
za3=j31*x (31) +j32*x (32)+j33*x (33);

if (za1>=delta)
    fz1=x (4);
    del_vx1=vax1- (x (1)-b1*x(3) );
    del_vy1=vay1- (x (2) + a1*x (3) );
    vabs1=sqrt (del_ vx1^2+del_ vy1^2);
    fx1=myu*sign (del_vx1) *fz1*abs (del_ vx1) /vabs1+bx*(del_vx1);
    fy1=myu*sign (del_vy1) *fz1*abs (del_vy1) /vabs1+by* (del_vy1);
    F11=j11*fx1+j21*fy1+j31*fz1;
    F21=j12*fx1+j22*fy1+j32*fz1;
    F31=j13*fx1+j23*fy1+j33*fz1;
    kz1=kz0;
else
    kz1=0;
    fx1=0; fy1=0; fz1=0;
    F11=0; F21=0; F31=0;
end if (za2>=delta)
    fz2-=x (5);
    del_vx2-vax2- (x (1)-b2*x (3) );
    del_vy2=vay2- (x (2) +a2*x (3 ) ) ;
    vabs2=sqrt (del_ vx2^2+del _vy2^2);
    fx2= myu*sign (del_vx2)*fz2*abs (del_vx2) /vabs2+bx* (del_vx2);
    fy2= myu*sign (del_vy2)*fz2*abs (del_vy2) /vabs2+by* (del_vy2);
```

FIGURE 20

```
    F12=j11*fx2+j21*fy2+j31*fz2;
    F22=j12*fx2+j22*fy2+j32*fz2;
    F32=j13*fx2+j23*fy2+j33*fz2;
    kz2=kz0;
else
    kz2=0;
    fx2=0; fy2=0; fz2=0;
    F12=0; F22=0; F32=0;
end
if (za3>=delta)
    fz3=x (6);
    del_vx3=vax3- (x (1)-b3*x (3) );
    del_vy3=vay3- (x (2) +a3*x (3) );
    vabs3=sqrt (del_vx3^2+del_vy3^2);
    fx3=myu*sign (del_vx3) *fz3*abs (del_vx3) /vabs3+bx* (del_vx3);
    fy3=myu*sign (del_vy3) *fz3*abs (del_vy3) /vabs3+by* (del_vy3);
    F13=j11*fx3+j21*fy3+j31*fz3;
    F23=j12*fx3+j22*fy3+j32*fz3;
    F33=j13*fx3+j23*fy3+j33*fz3;
    kz3=kz0;
else
    kz3=0;
    fx3=0; fy3=0; fz3=0;
    F13=0; F23=0; F33=0;
end
    xdot (1) =- (bs/ms*x (1) ) + 1/ms* (fx1+fx2+fx3);
    xdot (2) =-(bs/ms*x (2) ) +1/ms* (fy1+fy2+fy3);
    xdot (3) =- (bi/I*x (3) ) +1/ I* (-x (34)* (fy1+fy2+fy3)+x (35)* (fx1+fx2+fx3)...
         +a1*fy1+a2*fy2+a3*fy3 (b1*fx1+b2*fx2+b3*fx3) );
    xdot (4) =kz1*vaz1;
    xdot (5) =kz2*vaz2;
    xdot (6) =kz3*vaz3;
    xdot (7) = -1/ma*x (16) -ba/ma*x (7)-F11/ma+1/ma*N*e11;
    xdot (8) = -1/ma*x (17) -ba/ma*x (8) -F21/ma+1/ma*N*e21;
    xdot (9) = -1/ma*x (18) -ba/ma*x (9) -F31/ma+1/ma*N*e31;
    xdot (10) = -1/ma*x (19) -ba/ma*x (10) -F12/ma+1/ma*N*e12;
    xdot (11) = -1/ma*x (20) -ba/ma*x (11)-F22/ma+1/ma*N*e22;
    xdot (12) = -1/ma*x (21) -ba/ma*x (12)-F32/ma+1/ma*N*e32;
    xdot (13) = -1/ma*x (22) -ba/ma*x (13)- F13/ma+1/ma*N*e13;
    xdot (14) = -1/ma*x (23) -ba/ma*x (14)-F23/ma+1/ma*N*e23;
    xdot (15) = -1/ma*x (24) -ba/ma*x (15)-F33/ma+1/ma*N*e33;
    xdot (16)=1/cm*x (7);
    xdot (17) = 1/cm*x (8);
    xdot (18) =1/cm*x (9);
    xdot (19) =1/cm*x (10);
    xdot (20) =1/cm*x (11);
    xdot (21) =1/cm*x (12);
    xdot (22) =1/cm*x (13);
    xdot (23) =1/cm*x (14);
    xdot (24) =1/cm*x (15);
    xdot (25) =x (7);
    xdot (26) =x (8);
    xdot ( 27) =x (9);
    xdot (28) =x (10);
    xdot (29) =x (11);
    xdot (30) =x (12);
    xdot (31) =x (13);
    xdot (32) =x (14);
    xdot (33) =x (15);
    xdot (34) =x (1);
    xdot (35) =x (2) ;
    xdot (36) =x (3).
xdot =xdot ';
```

FIGURE 20A

```
% main simulation program for 3DOF stage motion by friction drive
% considering lateral compliances & vertical friction global freq omega theta_d1 theta_d2 theta_d3 ms I ma cm N g fp kz0 bs bi ba
global myu delta r ra rp v01 v02 v03 vr
global j11 j12 j13 j21 j22 j23 j31 j32 j33 bx by bz
global a1 b1 a2 b2 a3 b3
global e11 e21 e31 e12 e22 e32 e13 e23 e33
%_____
freq = 10^3;
direction1 = 60;
direction2 = 60;
direction3 = 60;
v01 = 150;
v02 = 150;
v03 = 150;
t0 = 0; tf=3*1/freq;
%_____
theta_d1=pi/180*direction1;
theta_d2=pi/180*direction2;
theta_d3=pi/180*direction3;

ms =1
I= ½ * (0.1)^2;
ma =0.1;
cm=0.02*10^ (-6);
N=8;
g=9.81;
fp=100;
% bs=100;
%%%%%%%%% Design parameters %%%
bs=10000;
bi=100;
kz0=10^ (7);
bx=10;
myu=0.2;
%%%%%%%%%%%%%%%%%%%%%%%
by=bx;
ba=3000;
bz=10000;

delta =10*10^ (-6);
r=2*10^ (-2);
ra=8*10^ (-2);
rp=2*10^ (-2);
%vr=x_0/z_0
vr=2;

% positions of three actuation systems
a1= ra*cos (0);b1=ra*sin (0);
a2=ra*cos (2*pi/3);  b2=ra*sin (2*pi/3);
a3=ra*cos (4*pi/3);  b3=ra*sin (4*pi/3);
% positions of three pzt elements
x1=r*cos (0);         y1=r*sin (0);
x2=r*cos(2*pi/3);     y2=r*sin (2*pi/3);
x3=r*cos (4*pi/3);    y3=r*sin (4*pi/3) ;
det= (x2*y3-x3*y2) - (x1*y3-x3*y1) + (x1*y2 - x2*y1);
```

FIGURE 20B

```
% calculation of Jacobian matrix
j11=rp*(y3-y2)/det; j12=rp*(y1-y3) /det; j13=rp*(y2-y1)/det;
j21=rp*(x2-x3)/det; j22=rp*(x3-x1)/det; j23=rp*(x1-x2)/det;
j31=1/3;      j32=1/3;    j33=1/3;

x0=[0 0 0 0 0 0 0 0 0 0 0 0 0 0 0 0 0 0 0 0 0 0 0 0 0 0 0 0 0 0 0 0 0 0 0 0];
[t,x]=ode45('d77', [t0 tf], x0);

%x(1)=x velocity of stage, x(2)=y velocity of stage figure
plot (t*10^3,x(:,1) *10^3,t*10^3,x(:,2)*10^3,t*10^3,x(:,3)*10^2,...
      t*10^3,x(:,34) *10^6,t*10^3,x(:,35)*10^6,t*10^3,x(:,36)*10^5,...
      t*10^3,x(:,4)/100)
legend ('X comp of stage velocity: Vsx[mm/s]','Y comp of stage velocity; Vsy[mm/s]',...
       'Angular velocity of stage: Vst[10mrad/sec]',...
       'X comp of stage displacement: Xs[um/s]','Y comp of stage displacement:
Ys[um/s]',...
       'Angular position of stage: Theta[10urad]','Normal force: Fcz[100N]')
axis ([0,3,-10,20])
grid
title('Time response of 3 DOF stage motion')
xlabel ('time [msec] ')
%ylabel('Xs[um], Ys[um], Theta[10mrad],Vsx[mm/s], Vsy[mm/s], Fcz[kN]')

figure
Plot (t*10^3,(v01*sin(omega*t)+cos(theta_d1)*vr*v01+cos(omega*t)*r/rp),...
     (t*10^3,(v01*sin(omega*t)-cos(pi/3+theta_d1)*vr*v01+cos(omega*t)*r/rp),...
     (t*10^3,(v01*sin(omega*t)-cos(pi/3-theta_d1)*vr*v01+cos(omega*t)*r/rp),...
axis ([0,3,-400,400])
grid
title('Voltage inputs to 3 piezo elements of the 1st actuation system')
xlabel ('time [msec] ')

figure
plot(t*10^3, (v02*sin(omega*t)+cos (theta_d2) *vr*v02*cos (omega*t) *r/rp),...
     (t*10^3, (v02*sin(omega*t)-cos (pi/3+theta_d2) *vr*v02*cos (omega*t) *r/rp),...
     (t*10^3, (v02*sin(omega*t)-cos (pi/3-theta_d2) *vr*v02*cos (omega*t) *r/rp),...
legend('e12', 'e22', 'e32')
axis ([0,3,-400,400])
grid
title('Voltage inputs to 3 piezo elements of the 2nd actuation system')
xlabel ('time [msec] ')

figure
plot(t*10^3, (v03*sin(omega*t)+cos (theta_d3) *vr*v03*cos (omega*t) *r/rp),...
     (t*10^3, (v03*sin(omega*t)-cos (pi/3+theta_d3) *vr*v03*cos (omega*t) *r/rp),...
     (t*10^3, (v03*sin(omega*t)-cos (pi/3-theta_d3) *vr*v03*cos (omega*t) *r/rp),...
legend('e13', 'e23', 'e33')
axis ([0,3. -400,400])
grid
title('Voltaqe inputs to 3 piezo elements of the 3rd actuation system')
xlabel ('time [msec]')

%figure
%plot(t*10^3, x(:, 3))
```

FIGURE 20C

```
%figure
%plot(t*10^3, x(:,36))

%plot(t,x(:,1)*10^3,t,x(:,2)*10^3,t,x(:,13)*10^6,t,x(:,14)*10^6,t,x,(:,3)/1000)
%hold
%plot((t(1:10:length(x(:,1))),x((1:10:length(x(:,1))),1)*10^3,'x',...
%     (t(1:10:length(x(:,1))),x((1:10:length(x(:,1))),2)*10^3,'+',...
%     (t(1:30:length(x(:,1))),x((1:30:length(x(:,1))),13)*10^6,'*',...

%  t(1:30:length(x(:,1))),x((1:30:length(x(:,1))),14)*10^6,'o',...
%  t(1:1:length(x(:,1))),x((1:1:length(x(:,1))),3) /1000,'-')
%axis([0,3.0e-3,0,3])
%text(0.15e-3,2.75,'*: Xs        0: Ys')
%text(0.15e-3,2.25, 'x: Vsx            +: Vsy        -: Fcz')
%grid
%title('Time response of stage motion')
%xlabel ('time [sec] ')
%ylabel('Xs[um], Ys[um], Vsx[mm/s], Vsy[mm/s], :Fcz[kN] ')
%hold off %plot (t,(j11*x(:,4)+j12*x(:,5) +j13*x(:,6)),...
        (t,(j21*x(:,4)+j22*x(:,5) +j23*x(:,6)),...
        (t,(j31*x(:,4)+j32*x(:,5) +j33*x(:,6))))
%grid
%title ('simulation')
%xlabel ('time [s]')
%ylabel ('vax & vay & vaz [m/s]')

%plot(x(:,1),(:,2))
%grid
%title ('simulation')
%xlabel('x velocity of stage [m/s]')
%ylabel('y velocity of stage [m/s]')

figure
plot (x(:,34)*1e6,x(:,35)*1e6)
axis ([0, 6, 0, 6])
grid
xlabel('X comp of stage displacement [um]')
ylabel ('Y comp of stage displacement [um]')
```

FIGURE 20D

OMNI-DIRECTIONAL HIGH PRECISION FRICTION DRIVE POSITIONING STAGE

CROSS-REFERENCE TO RELATED APPLICATIONS

This application claims priority to U.S. Provisional Application No. 60/085,481, entitled An Omni-Directional High Precision Friction Drive Positioning Stage, filed on May 14, 1998, which Provisional application is incorporated herein by reference in its entirety.

STATEMENTS REGARDING FEDERALLY SPONSORED RESEARCH

Not applicable.

BACKGROUND OF THE INVENTION

The demand for high precision positioning systems, or stages has grown rapidly in some key industries. Applications for such systems include semiconductor manufacturing equipment, high precision machining optics (lenses and mirrors) and mass data storage. For example, semiconductor manufacturing equipment will soon require 0.1–1 nm precision, and 30×30 cm$^2$ travel range.

A friction drive system has a simple structure as described in a paper entitled *Transmission Systems of Motion and Force-Friction Drive/Traction Drive*, K Adachi et al., Journal of Japan Society of Precision Engineers, Vol. 60, No. 10, pp. 1410–1415, 1994, which is incorporated herein by reference. Since no gear reduction unit is used, no backlash exists. The position of the stage, which often takes the form of a platform or table, is very stable due to a large static frictional force. Friction drive systems do not require a lubricant and therefore, can be adequate for use in clean environments. However, a friction drive requires strong wear resistant materials of which many reliable types have been reported.

Friction drive is appropriate for applications requiring small load but high precision. In practice, many one dimensional or two dimensional (hereinafter 1-D or 2-D, respectively) high precision friction drive stages have been developed because of the advantages listed above. 1-D high precision friction drive positioning stages with nanometric precision are described in: *Nanometric Motion Control of a Traction Drive*, P. I. Ro et al., Dynamic Systems and Control, Vol. 2 ASME, pp. 879–883, 1994 and *Precision Table Control System by Friction Drive for Optical Disk Mastering Machine*, S. Sakuta et al., Journal of Japan Society of Precision Engineers, Vol. 62, No. 10, pp. 1444–1448, 1996. Most of the developed high precision positioning stages which use friction drive are usually actuated in 2-D by the use of two 1-D stages as described in *The Micropositioning Book, Burleigh Instruments, Inc.,* Burleigh Park, Fishers, N.Y., 14453, 1990 and *Ultrasonic Linear Motor for a High Precision X-Y Stage*, K. Mori et al., Proceedings of Ultrasonic Symposium, pp. 657–660, 1989 and Nikkei Mechanical, No. 507, pp. 74–79, May 26, 1997 (in Japanese). For three degree of freedom motion such as X-Y-θ motion, the stage system usually uses three 1-D stages. Consequently, the system's structure and control scheme are more complex. In addition, the weight of the stage system itself is larger and more expensive.

On the other hand, some innovative 2-D friction driven stages, using only one stage, have been proposed by several researchers. However, most of the designs do not allow diagonal motion as is the case in systems described in: *New Multi-Degree of Freedom Piezoelectric Micromotors for Micromanipulator Applications*, A. Ferreira et al., Proceedings of IEEE Ultrasonic Symposium, pp. 417–422, 1995 and *A Linear Ultrasonic Motor for Nano-Technology*, H. Choi, Master's Thesis, Massachusetts Institute of Technology, 1996. Each move is either in the X or Y direction at any one time, resulting in a slow rectangular motion. The reason for this is that the motion in one direction prevents the motion in the other direction.

A 2-D stage design, which uses one stage and is capable of diagonal motion, was achieved by using a 2-D surface acoustic wave as described in *Ultrasonic Linear Motor using Surface Acoustic Waves,* M. Kurosawa et al., TEEE Trans. on Ultrasonics, Ferroelectrics, and Frequency Control (UFFC), Vol. 43, No. 5, pp. 901–906, 1996. However, this paper reported that the stage is not reliable because it has an aging problem due to very small vibration amplitude (5 nm), and the motion is unstable. Further, this system may require expensive power electronic components due to its high operating frequency (10 MHZ). N. Hoshi et al. proposed an array type of 2-D stage which can move diagonally in a paper entitled *Analysis of Plane Ultrasonic Piezoelectic Actors*, IEEE Industry Applications Magazine, July/August, pp. 24–29, 1995. In principle, this system can only move semi-diagonally because the number of movement direction choices is limited. Further, its cost may be high due to a complex structure.

BRIEF SUMMARY OF THE INVENTION

According to the invention, an omni-directional high precision friction drive positioning stage system is provided. The proposed system has only one movable stage capable of omni-directional movement with three degrees of freedom. The three degrees of freedom include two linear (X and Y) and one rotational (θ) about the Z axis. Stated differently, the stage can move in X and Y (i.e., any direction in the plane of stage) and can also be rotated in the plane of the stage about the Z axis. In one embodiment, the stage uses three special actuation systems, each of which is designed to generate a directional elliptical motion which allows the stage to move in X, Y and θ. The design has a simple structure, low cost, and high precision.

The friction drive positioning stage system includes a substantially planar stage and a plurality of actuation systems, each having a tip in contact with a surface of the stage. The tip of each such actuation system is movable in an elliptical path disposed in a rotatable plane substantially orthogonal to the plane of the stage. Stated differently, the tip of each such actuation system is capable of directional elliptical motion. Each of the actuation systems is independently controllable in order to permit the stage to be moved in 2-D (X and Y) as well as rotated (θ). In one embodiment, the friction drive positioning stage system includes three such actuation systems, each one having a tip in contact with the stage.

Also described is an actuation system suitable for use with the above-described friction drive system. The actuation system includes a plurality of elongated actuation members and a substantially rigid hat-shaped element attached to an end of each of the elongated members and having a rounded portion at which the tip is disposed. Each of the elongated actuation members is preferably angularly spaced from the other such members by 120 degrees. The elongated actuation members are comprised of a piezoelectric material.

In accordance with a further aspect of the invention, a method for moving a stage having a substantially planar surface in 2-D and in rotation includes the steps of providing a plurality of actuation systems, each having a tip which is movable in an elliptical path disposed in a rotatable plane substantially orthogonal to the plane of the stage. The method further includes the step of independently controlling the angle of the plane of the elliptical path of each actuation system.

With the above-described apparatus and techniques, an improved friction drive system is provided which is capable of moving the stage in 2-D as well as in rotation in a simple and cost effective manner. The omni-directional (X, Y, θ) positioning system of the present invention has advantages of simple structure, low cost, as well as high precision positioning capability, such as precision on the order of one nanometer or less.

BRIEF DESCRIPTION OF THE DRAWINGS

The foregoing features of this invention, as well as the invention itself, may be more fully understood from the following description of the drawings in which:

FIG. 2A shows one illustrative structure for applying a preload force to the stage;

FIGS. 20–20D contain simulation code for simulating the movement of the stage in response to the signals of FIGS. 17–17D, 18–18D, and 19–19D.

DETAILED DESCRIPTION OF THE INVENTION

Figure 1:
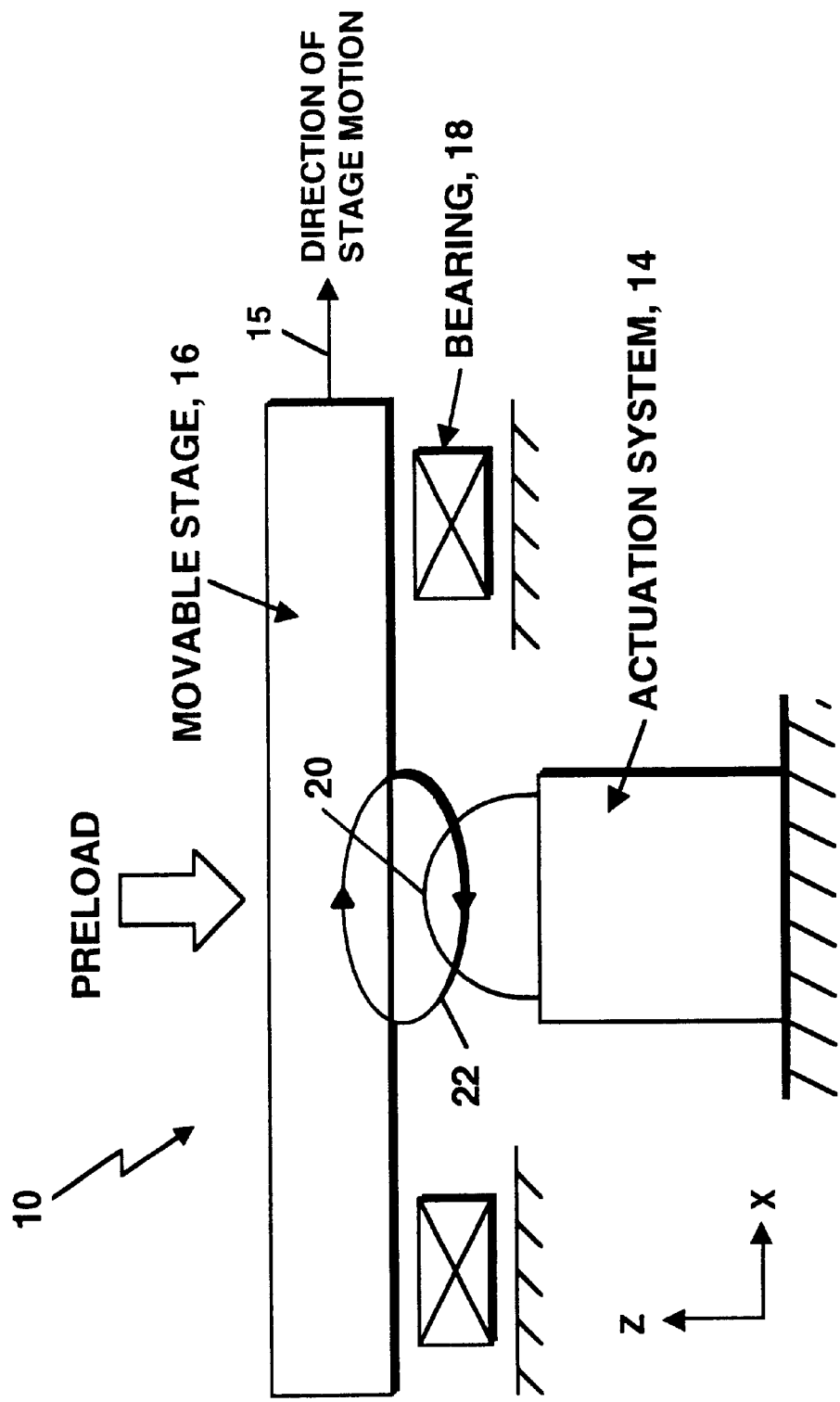
FIG. 1 shows a 1-D friction drive positioning stage system including an elliptical motion actuation system.

Before discussing the friction drive positioning stage system of the present invention, consider a 1-D friction drive system 10 and the elliptical motion of an actuation system 14 of the stage system, shown in FIG. 1. A 1-D stage 6, properly held by a bearing system 18, is free to move in the horizontal X direction (labeled 15). The stage is constrained by a preload force and its weight in the vertical Z direction. The actuation system 14 generates X and Z vibration motions. The tip 20 of the actuation system makes an elliptical locus (i.e., moves in an elliptical pattern, or path 22) such that the X and Z vibrations have the same frequency but with a 90 degree phase shift. The elliptical motion of the tip 20 in the XZ plane allows the stage 16 to move only in the X direction by the friction force between the stage and the tip 20 of the actuation system.

Figure 2:
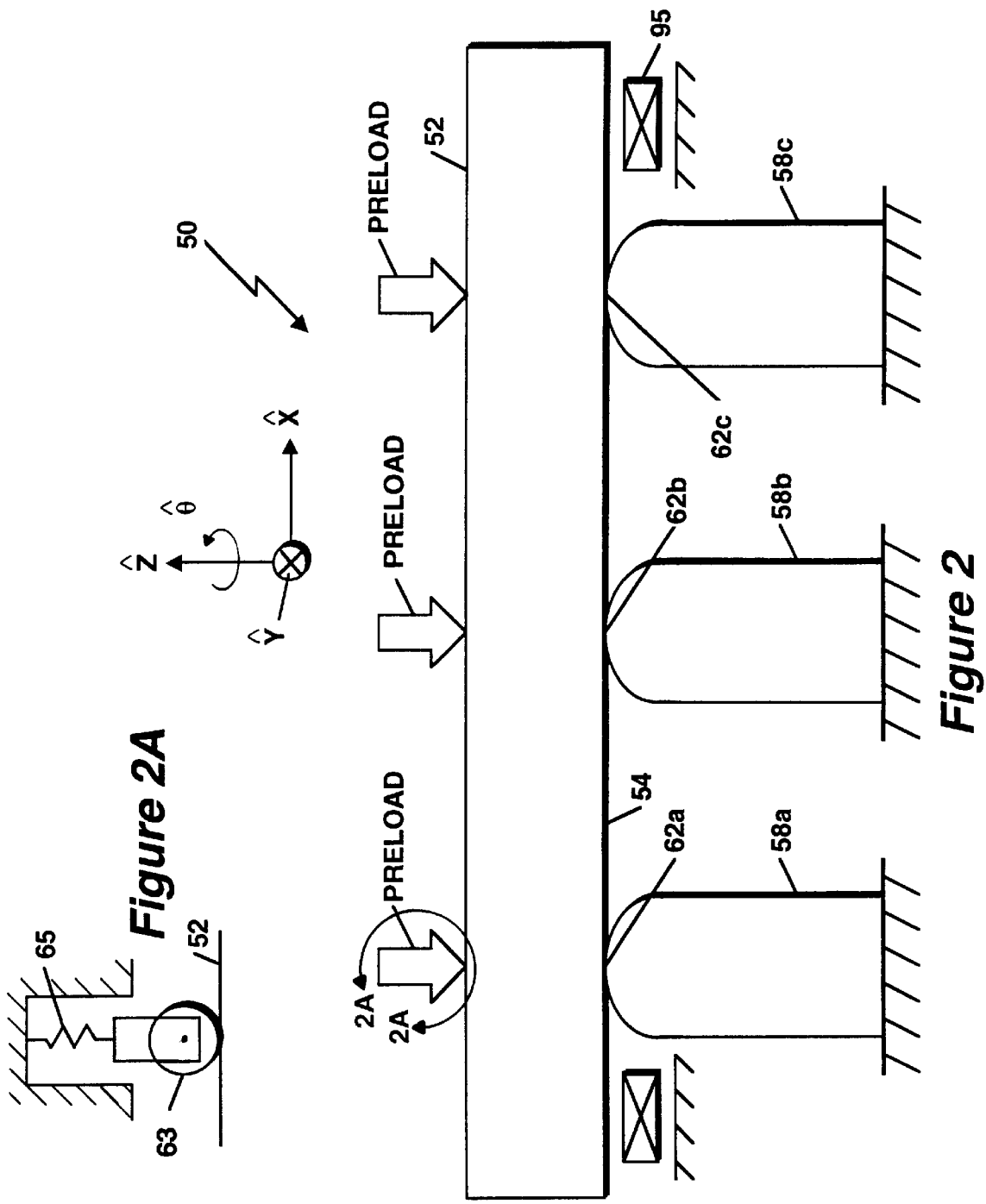
FIG. 2 illustrates a friction drive positioning stage system including three actuation systems capable of directional elliptical motion according to the present invention.

Referring to FIG. 2, a friction drive positioning stage system 50 according to the invention includes a stage 52 and a plurality of actuation systems 58a, 58b, and 58c (which will be described in conjunction with FIG. 6), each one capable of independent directional elliptical motion. The stage is movable with three degrees of freedom. In particular, the stage is movable in any direction in the plane of the stage (X and Y) and is also rotatable about the Z axis (θ).

Figure 3:
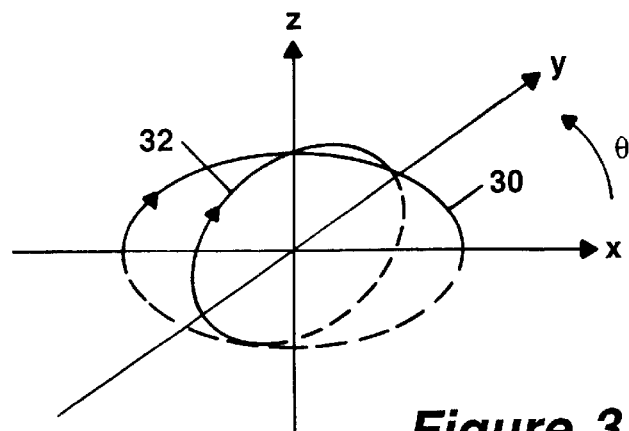
FIG. 3 illustrates the directional elliptical motion of an actuation system according to the present invention.

Referring also to FIG. 3, the directional elliptical motion of the tip of each of the actuation systems 58a–58c is illustrated. The tip is movable in a plurality of elliptical paths (of which two such paths 30, 32 are shown), with each such path being in a plane orthogonal to the plane of the stage (i.e., the plane of the stage is the XY plane). While illustrative elliptical path 30 is disposed in the XZ plane and illustrative elliptical path 32 is disposed in the YZ plane, more generally, the plane of the elliptical path of the tip is rotatable through 360° relative to the Z axis. Thus, the tip of an actuation system capable of directional elliptical motion can be positioned in space with three degrees of freedom; namely, X (the horizontal axis on an elliptical locus plane), Z (the vertical axis on an elliptical locus plane) and θ (rotation of an elliptical locus plane).

Preferably, three such actuation systems 58a–58c are provided, with each one having a tip 62a–62c, respectively, in contact with a bottom surface 54 of the stage. The stage 52 is supported by a bearing system 95 which prevents the stage from moving in the negative Z direction (i.e., down) and permits the stage to move in any direction in the XY plane (in X, Y, and θ). The stage is prevented from moving in the positive Z direction (i.e., up) by its weight and by a preload force. While the preload force can be applied in various ways, one example is shown in FIG. 2A to include a free moving roller 63 and a spring 65.

More generally, the system 50 requires at least three actuation systems 58a–58c in order to achieve three degrees of freedom motion of the stage. However, it will be appreciated by those of ordinary skill in the art however, that more than three actuation systems 58 may be used in the system 50. The use of additional actuation systems provides additional mechanical power; however, more electrical power would be required to drive the additional actuation systems, thereby increasing the cost of the system (as well as the complexity due to increased controller requirements).

Each of the actuation systems 58a–58c is angularly spaced from the others, preferably by approximately 120 degrees. The stage 52 can be offset relative to the actuation systems or can be maintained substantially centered relative to the actuation systems, depending on system requirements, and still achieve desired positioning in X, Y and θ. The position and angle of the stage 52 relative to the actuation systems 58a–58c may be sensed by position and angle sensors in order to provide feedback signals, as discussed below in conjunction with FIG. 10.

Figure 4:
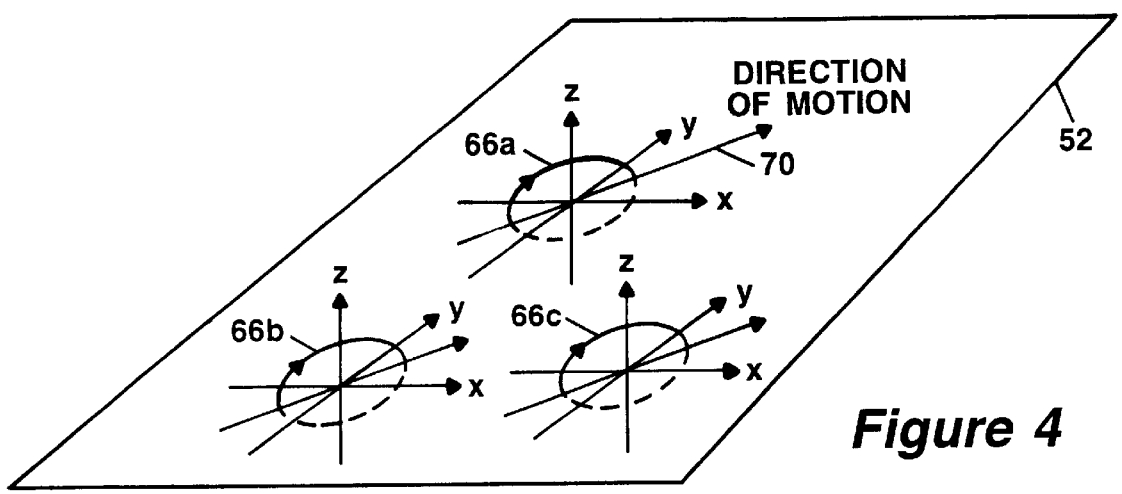
FIG. 4 illustrates exemplary elliptical locii of the three actuation systems of FIG. 2 suitable for moving a stage along a diagonal axis relative to X and Y axes.
Figure 5:
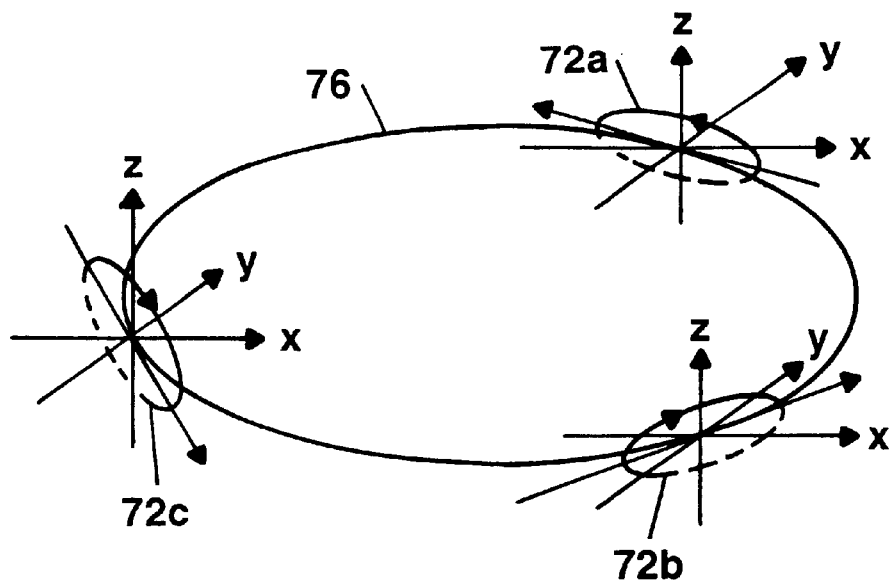
FIG. 5 illustrates alternative exemplary elliptical locii of the three actuation systems of FIG. 2 suitable for imparting rotational motion to a stage.

By using three actuation systems 58a–58c each of which is capable of directional elliptical motion, the stage 52 is movable in 2-D and rotationally (i.e., in X, Y and θ). As one example, FIG. 4 illustrates that when the tip of each of the three actuation systems 58a–58c moves in an elliptical path 66a, 66b, and 66c, respectively, the stage 52 moves diagonally along an axis 70. A further example is shown in FIG. 5, in which the tip of each of the actuation systems moves in an elliptical path 72a, 72b, and 72c, respectively, with the planes of each of the paths 72a–72c being angularly spaced by 120 degrees. With this particular arrangement, the stage rotates along a trajectory 76. It will be appreciated by those of ordinary skill in the art that by combining appropriately the linear and rotational motions illustrated above, omni-directional stage motion can be achieved.

Figure 6:
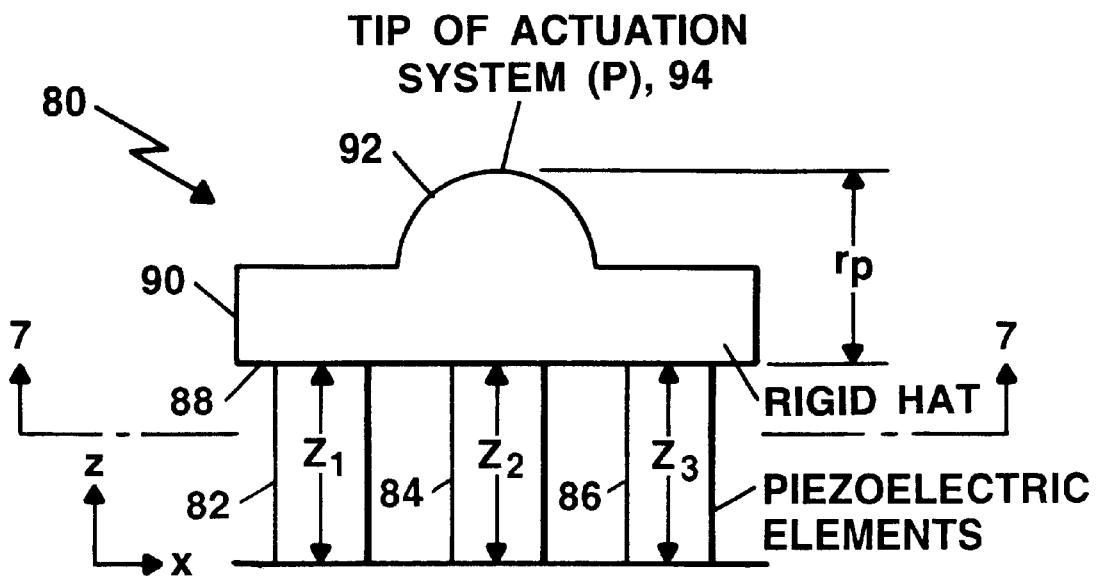
FIG. 6 shows an actuation system capable of directional elliptical motion according to the invention.

Referring also to FIG. 6, an actuation system 80 (like actuation systems 58a–58c of FIG. 2) which generates a directional elliptical motion is shown. Three piezoelectric actuators 82, 84 and 86 (referred to alternatively as elongated actuation members) are attached to a bottom surface 88 of a rigid hat-shaped, or hat element 90. The actuators 82, 84 and 86 may be attached to the bottom surface 88 by any suitable means, such as by bonding with an adhesive, epoxy resin.

The hat element 90 has a rounded upper portion 92 at which the tip 94 of the system is located. The hat element 90 is comprised of a rigid, wear resistant material. Illustrative materials for the hat element include stainless steel and phosphor bronze. In the illustrative embodiment, the height $r_p$ of the hat element 90 is on the order of between one and two centimeters. The greater the height $r_p$ of the hat element, the larger the elliptical locus and the larger the velocity source the actuation system 80 is capable of providing to the stage.

Each of the elongated actuation members 82, 84 and 86 is comprised of a piezoelectric material and will be described further below in conjunction with FIG. 9. Suffice it to say here that the members 82–86 are independently controllable and movable in order to render the tip 94 capable of directional elliptical motion. In the illustrative embodiment, the height $Z_1$, $Z_2$, and $Z_3$ of each of the elongated actuation members 82–86, respectively, is on the order of five centimeters and the diameter of each such member is on the order of one centimeter. The actuation member height can be readily varied. The longer the actuation members, the larger the maximum displacement of the actuation system 80 along the Z axis. The actuation member diameter can also be readily varied. The larger the actuation member diameter, the larger the maximum force that the actuation member can provide. Desirable parameters of the actuation members 82–86 include a maximum displacement along the Z axis on the order of forty micrometers, a maximum force on the order of 800 newtons and a maximum driving voltage on the order of 150 volts.

It will be appreciated by those of ordinary skill in the art that while the actuation system 80 includes at least three elongated actuation members 82–86 in order to achieve directional elliptical motion, more than three elongated actuation members may be used.

Figure 7:
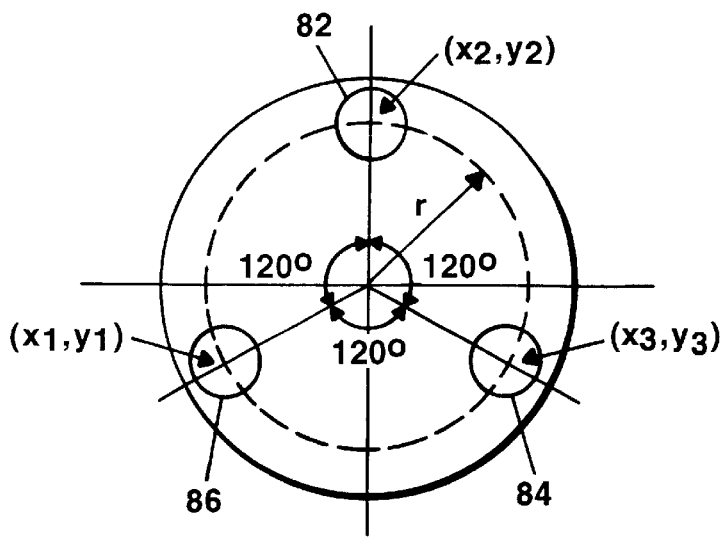
FIG. 7 is a cross-sectional view of the actuation system of FIG. 6 taken along line 7—7 of FIG. 6.

Referring also to FIG. 7, a cross-sectional view of the actuation system 80 of FIG. 6 illustrates the spacing of the three elongated actuation members 82–86. In the illustrated embodiment, the members 82–86 are located on the circumference of a circle on an XY plane having a radius r which is on the order of two centimeters. However, it will be appreciated by those of ordinary skill in the art that the radius r can be readily varied. The larger the radius r, the more precise the resolution of the movement of the tip 94 and the stage positioning possible. Preferably, the angle between the actuation members is 120 degrees, as shown.

Figure 8:
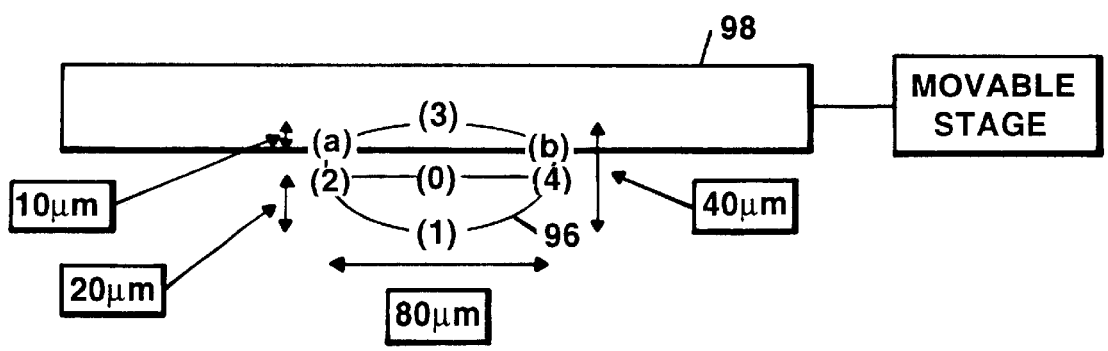
FIG. 8 shows an illustrative elliptical locus of the tip of the actuation system of FIG. 6.

Referring to FIG. 8, an illustrative elliptical loci 96 of an actuation system 80 of the type shown in FIG. 6 is shown relative to a movable stage 98. The tip 94 of the actuation system is located at a nominal position (0) when no driving voltage is applied to the elongated actuation members 82–86. In the nominal position, the tip 94 is spaced from the bottom surface of the stage by approximately ten micrometers, as provided by the bearing system 95 (FIG. 2).

With appropriate excitation signals (i.e., drive voltages or currents) applied to the elongated actuation members 82–86, the tip 94 of the actuation system 80 moves from position (1) to position (2), to position (a), to position (3), to position (b), to position (4) and to position (1). The time it takes the tip 94 to travel from position (a) to position (b) is the contact period, during which power is transferred from the actuation system 80 to the movable stage 98; whereas, the time it takes the tip 94 to move from position (b) to position (a) is the non-contact period when power is not transferred from the actuation system to the stage.

During the contact period, the bottom surface of the stage 98 is deformed because that part is thin film coated with a friction material, such as high polymer, which is relatively less stiff than the hat element 90. In the illustrative embodiment, the bottom surface of the stage is deformed on the order of ten micrometers, as shown. For large driving forces on the movable stage 98, it is necessary to coat the bottom surface of the stage 98 with a material having a larger friction coefficient, a larger viscous friction resistance, and a larger stiffness, such as a high polymer.

By appropriate combination of elongation and constriction of the three piezoelectric elements in the Z direction, the tip 94 of the actuation system can be positioned in space with three degrees of freedom; namely, X (the horizontal axis on an elliptical locus plane), Z (the vertical axis on an elliptical locus plane) and θ (rotation of an elliptical locus plane) (see FIG. 3). The mathematical expression relating the Z direction of all motions of the three piezoelectric actuators ($z_1$, $z_2$ and $z_3$) and the position vector of the tip $p_x$, $p_y$ and $p_z$), can be obtained using kinematic analysis, as discussed below.

Figure 9:
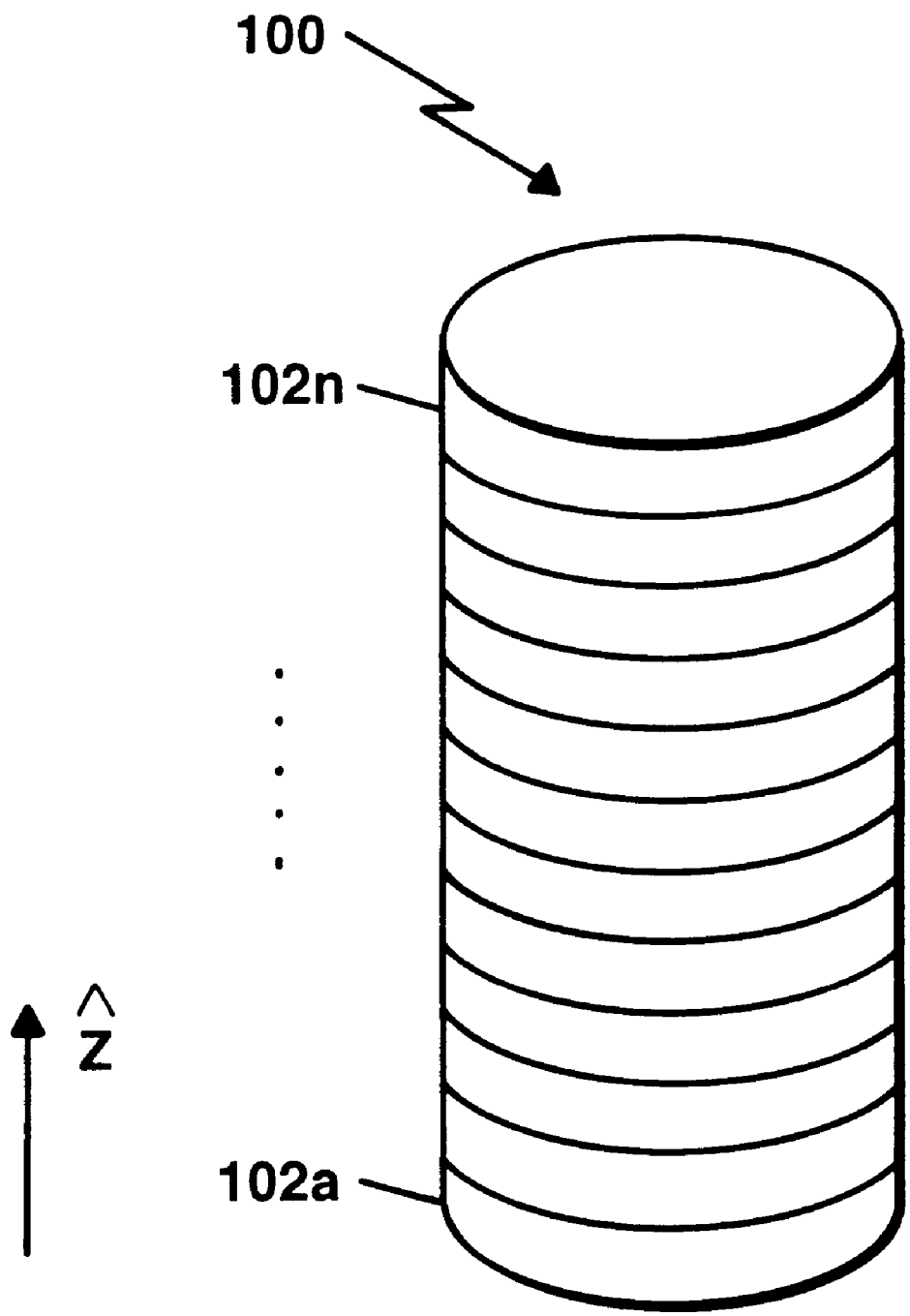
FIG. 9 illustrates one embodiment of an elongated actuation member of the actuation system of FIG. 6 including a plurality of stacked piezoelectric elements.

Referring to FIG. 9, one illustrative elongated actuation member 100 suitable for use with the actuation system 80 of FIG. 6 includes a plurality of stacked piezoelectric disc elements 102a–102n. The multi-layered actuation member 100 is capable of contracting and expanding along the Z axis. Alternating elements 102a–102n are commonly driven by an electrical signal in order to achieve such constriction and expansion. Various piezoelectric materials are suitable for forming the piezoelectric elements, such as PZT and zinc oxide. It will be appreciated by those of ordinary skill in the art that other types of elongated actuation members are possible to achieve the desired constriction and expansion along the Z axis.

Figure 10:
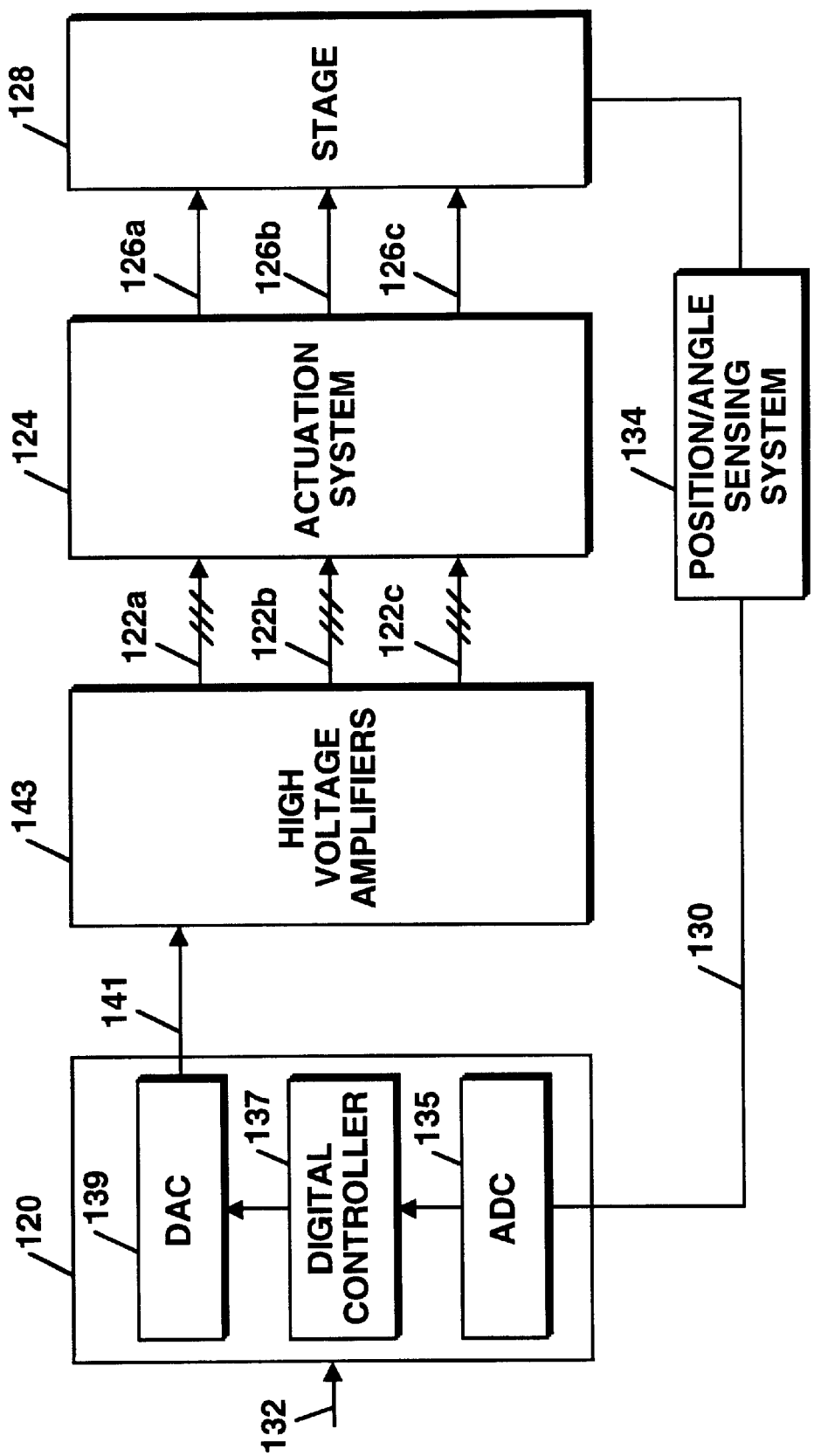
FIG. 10 is a block diagram of the friction drive positioning stage system of FIG. 2.

Referring also to FIG. 10, a block diagram of a friction drive positioning stage system according to the present invention is shown to include a controller 120, which may take the form of a computer, actuation systems 124 and a movable stage 128. Preferably, the actuation systems 124 include three actuation systems 80 of the type shown in FIG. 6. The controller 120 is responsive to a feedback signal 130 from a position/angle sensing system 134 which is indicative of the X position, the Y position and the rotational position θ of the stage relative to the actuation systems. The feedback signal 130 may be generated with the use of various types of sensors, such as laser position sensors. The controller 120 is further responsive to external inputs 132 which may be user provided or predetermined. For example, user provided external inputs 132 may specify a desired position and/or velocity for the stage and may be referred to as "reference inputs."

The information provided to the controller 120 is transferred to a digital controller 137 through an analog-to-digital converter (ADC) 135. Inside the digital controller 137, based on the position and angle signal 130 and the external input 132, the digital controller computes control signals which are converted to analog signals by a digital-to-analog converter (DAC) 139. The analog signals 141 are amplified by high voltage amplifiers 143 and transferred to the actuation systems 124.

More particularly, in response to the feedback signal 130 and to external inputs 132, the controller 120 generates at least nine excitation signals 122a, 122b and 122c for the elongated actuation members of the actuation systems 124 (i.e., one voltage or current source signal for each of the three elongated actuation members of each of the three actuation systems). The controller is designed to minimize the errors between the input (e.g., desired stage position and velocity) and the output (e.g., actual stage position and velocity). The controller takes into account the time varying nonlinear dynamics of the stage and thus, the excitation signals generated by the controller are dependent on the location of the stage with respect to ground (i.e., the actuation systems). Illustrative excitation signals and the resulting stage displacement are shown in FIGS. 17–19D.

In response to the excitation signals 122a–122c, the tip of each of the actuation systems experiences directional elliptical motion. The output signal 126a, 126b, and 126c of each of the actuation systems is thus a force vector ($\bar{F}$) applied to the stage 128 at the point of contact between the tip of the respective actuation System and the stage in order to impart the desired 2-D and/or rotational motion to the stage 128.

The kinematics of the actuation system 80 of FIG. 6 will be described using the following variables and parameters. The position of point P, located at the tip 94 of the actuation system of FIG. 6, and points $L_1$, $L_2$ and $L_3$ at the top of the piezoelectric actuators are represented by the vectors $p^T=[p_x, p_y, P_z]$, $L_1^T=[x_1,y_1,z_1]$, $L_2^T=[x_2,y_2,z_2]$ and $L_3^T=[x_3,y_3,z_3]$ respectively. The position of point P in terms of the elongation of the piezo actuators 82, 84 and 86 is given by:

$$P = \begin{pmatrix} p_x \\ p_y \\ p_z \end{pmatrix} = \frac{L_1 + L_2 + L_3}{3} + \frac{r_p}{\sqrt{a^2 + b^2 + 1}} \begin{pmatrix} a \\ b \\ 1 \end{pmatrix} \quad (1)$$

where the constants a and b are given by, $$a = \frac{(-z_2 y_3 + z_3 y_2) - (-z_1 y_3 + z_3 y_1) + (-z_1 y_2 + z_2 y_1)}{(-x_2 y_3 - x_3 y_2) - (x_1 y_3 - x_3 y_1) + (x_1 y_2 - x_2 y_1)}, \quad (2)$$

$$b = \frac{(-x_2 z_3 + x_3 z_2) - (-x_1 z_3 + x_3 z_1) + (-x_1 z_2 + x_2 z_1)}{(x_2 y_3 - x_3 y_2) - (x_1 y_3 - x_3 y_1) + (x_1 y_2 - x_2 y_1)}, \quad (3)$$

$r_p$ is given as in FIG. 6.

The components ($P_x$, $P_y$, $P_z$) of the position vector of the tip are nonlinear functions of Z directional positions $z_1$, $z_2$ and $z_3$ of the three piezoelectric elements. Here, let $P_x$ be $f_1(z_1, z_2, z_3)$, $P_y$ be $f_2(z_1, z_2, z_3)$, and $P_z$ be $f_3(z_1, z_2, z_3)$. And $P_x$, $P_y$, $P_z$ are given in equation (1). And this expression can be used to determine relations for the velocities and forces as follows:

$$[\delta p_x, \delta p_y, \delta p_z]^T = J(z_1,z_2,z_3)[\delta z_1, \delta z_2, \delta z_3]^T. \quad (4)$$

where $$\left( J_{ij} = \frac{\partial f_i}{\partial z_j} \right)\bigg|_{(z_1, z_2, z_3)} \quad (5)$$

Here, $J_{ij}$ is an element of Jacobian matrix, and physically means the sensitivity. For desired tip resolution of $\delta p_i$, the elongation of a piezoelectric element of $\delta z_i$ is needed and determined by $$\frac{\delta p_i}{J_{ij}}.$$

Therefore, the components of the position vector of the tip can be related to the elongations of three piezoelectric elements mathematically. Now differentiating with respect to time, the relation between the velocity vector of the tip and the z directional velocities of the three piezoelectric elements can be also obtained, $$\frac{dp}{dt} = J \left[ \frac{dz_1}{dt}, \frac{dz_2}{dt}, \frac{dz_3}{dt} \right]^T. \quad (6)$$

Let the force of the tip and the force of three piezoelectric elements be represented by $f=[f_x, f_y, f_z]^T$ and $F=[F_1,F_2,F_3]^T$, respectively. Then the relation of these two forces are as follows:

$$F = J^T f. \quad (7)$$

Figure 11:
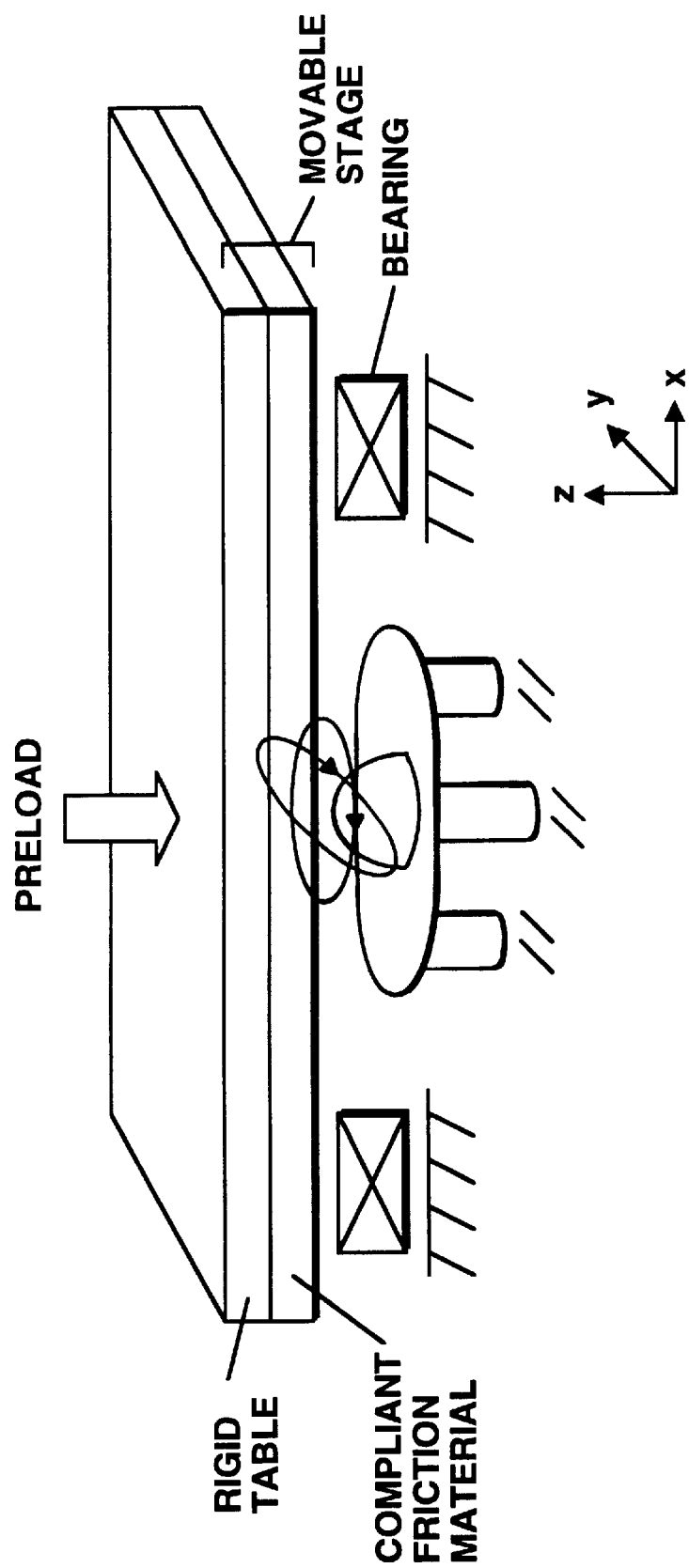
FIG. 11 illustrates a friction drive positioning stage system including a single directional elliptical motion actuation system for modeling and analysis purposes.
Figure 12:
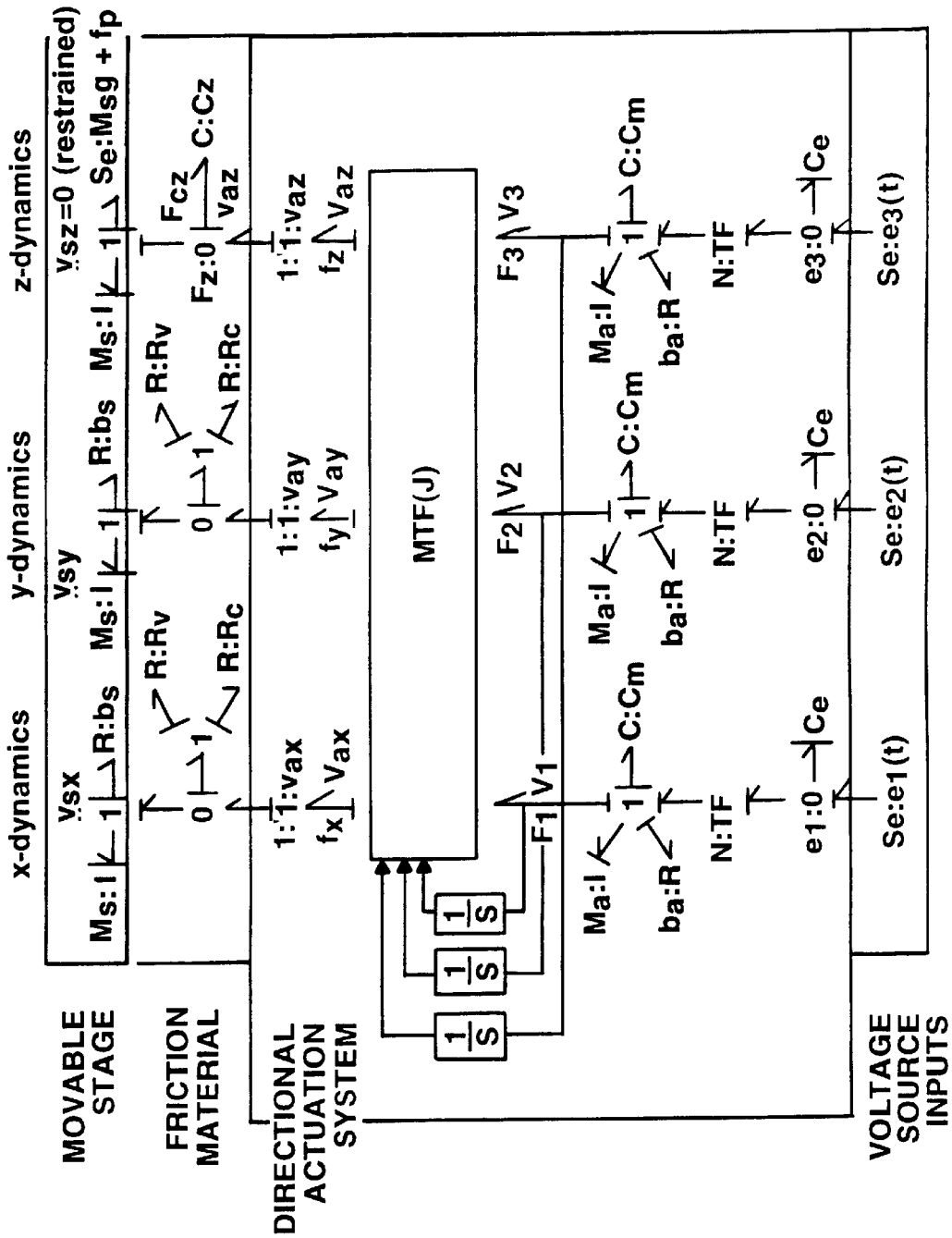
FIG. 12 is a bond graph model of dynamics for the system of FIG. 11.

In order to understand the behavior of the friction drive positioning stage system, using the actuation system 80 of FIG. 6, a dynamic analysis of a 2-D linear stage with one directional actuation system of the type shown in FIG. 6 is considered. The stage to be modeled is shown in FIG. 11 and its associated bond graph model is depicted in FIG. 12. In this model, the velocities in the x and y directions are outputs of the stage motion. Three voltage excitation signals to three piezoelectric actuators 82–86 are inputs.

Here, it is assumed that the stage is properly clamped and restrained to a fixed position in the z direction; but the z directional compliance of the friction material on the bottom surface of the stage is considered. This means that the magnitude of the Coulomb friction force becomes a function of time. The driving forces for moving the stage in the x and y directions are dominantly composed of a Coulomb friction force and a viscous friction force. The compliance in the x and y directions is neglected. Also, the kinematic relation (Jacobian matrix) between the velocities and forces of the three piezoelectric actuators and those of the tip are considered as in the kinematic analysis above. Further assumptions include that the tip structure (i.e., hat element 90 of FIG. 6) is rigid and its dynamics are neglected; and that the inputs to the piezoelectric elements are voltage sources. Note that when the tip does not contact the bottom surface of the stage, the power flow from the tip to movable stage is zero. Therefore, load forces ($F_1$, $F_2$, $F_3$) for the actuation system side point of view are zeros, and effective driving forces acting on the movable stage ($f_x$, $f_y$, $f_z$) are zero too.

In FIG. 12, $e_1(t)$, $e_2(t)$, and $e_3(t)$ are voltage inputs to each piezoelectric element 82–86; $C_e$ and $C_m$ are electrical and mechanical capacitances of each piezoelectric element, respectively; TF is a transformer; N is the transformer modulus; $M_a$ is the mass of each piezoelectric element; $b_a$ is the mechanical resistance of each piezoelectric element $$v_1 = \frac{dz_1}{dt}, v_2 = \frac{dz_2}{dt}, v_3 = \frac{dz_3}{dt},$$

are the z directional velocities of piezoelectric elements #1, #2 and #3 respectively; MTF is a modulated transformer (J); $v_{ax}$, $v_{ay}$, $v_{az}$: x, y, z velocities of the actuation system respectively; the variables $f_x$, $f_y$, $f_z$, $F_1$, $F_2$, $F_3$ were determined in the kinematic analysis above; $R_v$ and $R_c$ are viscous and Coulomb friction resistances, respectively; $M_z$ is the mass of the stage; b, is the mechanical resistance of the stage; $C_z$ is the mechanical compliance of the friction material in the z direction, $v_{sx}$, $V_{sy}$, $v_{sz}$ are the stage velocities in the x, y and z directions respectively; Mg is the stage gravitation force; p is a friction coefficient; and $f_p$ is the preloaded force.

The causalities in the bond graph model of FIG. 12 explain that the actuation system 80 driven by three piezoelectric elements 82–86 with voltage inputs is a kind of velocity source to the rest of the system including the friction material and the stage. Of course, this velocity source is not ideal but depends on its dynamics as well as dynamic loads. The x and y directional driving force sources acting on the movable stage are determined by constitutive laws for the viscous forces associated with $R_v$ as well as the Coulomb friction forces associated with $R_c$. In other words, the relative velocity between the stage and the tip in each direction is acting on $R_v$ and $R_c$, the resultant forces are determined by constitutive laws for those elements ($R_v, R_c$). And these forces become effective forces acting on the moveable stage. Note that the viscous force may play a role, in particular, during transients when the relative velocity is large. On the contrary, at steady state, the Coulomb friction might be dominant. Moreover, since the magnitude of the Coulomb friction force depends on $F_{cx}$, it is also a time varying function. During the contact period, the actuation system is connected to the movable stage from a power flow point of view, and the stage is accelerated by translated power from the actuation system, but during the non contact period, the stage system is completely isolated from the actuation systems, and it undergoes a deceleration process due to viscous friction in bearing systems.

The state equations for the model during the contact period in FIG. 12 are, $$M_s \frac{dv_{sx}}{dt} = -b_s v_{sx} + f_x, \qquad (8)$$

$$M_s = \frac{dv_{sy}}{dt} = -b_s v_{sy} + f_y, \qquad (9)$$

$$C_z \frac{dF_{cz}}{dt} = v_{az}, \qquad (10)$$

$$M_a \frac{dv_1}{dt} = -F_{cm1} - b_a v_1 + Ne_1(t) - F_1, \qquad (11)$$

$$M_a \frac{dv_2}{dt} = -F_{cm2} - b_a v_2 + Ne_2(t) - F_2, \qquad (12)$$

$$M_a \frac{dv_3}{dt} = -F_{cm3} - b_a v_3 + Ne_3(t) - F_3, \qquad (13)$$

$$C_m \frac{dF_{cm1}}{dt} = v_1, \qquad (14)$$

$$C_m \frac{dF_{cm2}}{dt} = v_2, \qquad (15)$$

$$C_m \frac{dF_{cm3}}{dt} = v_3, \qquad (16)$$

where $$f_x = \mu \frac{(v_{ax} - v_{sx}) f_z}{\sqrt{(v_{ax} - v_{sx})^2 + (v_{ay} - v_{sy})^2}} + R_v(v_{ax} - v_{sx}),$$

$$f_y = \mu \frac{(v_{ay} - v_{sy}) f_z}{\sqrt{(v_{ax} - v_{sx})^2 + (v_{ay} - v_{sy})^2}} + R_v(v_{ay} - v_{sy}), f_z = F_{cx},$$

$$v_{ax} = J_{11}v_1 + J_{12}v_2 + J_{13}v_3, v_{ay} = J_{21}v_1 + J_{22}v_2 + J_{23}v_3,$$

$$v_{az} = J_{31}v_1 + J_{32}v_2 + J_{33}v_3, F_1 = J_{11}f_x + J_{21}f_y + J_{31}f_z,$$

$$F_2 = J_{12}f_x + J_{22}f_y + J_{32}f_z, F_3 = J_{13}f_x + J_{23}f_y + J_{33}f_z.$$

For simplicity of illustration, we have not included the state equations for the non-contact phase.

In order to verify the concept of the model shown in FIG. 12, the 2-D linear stage motion is simulated. In this simulation, the z directional position of the tip of the actuation system can be a measure for the criterion for finding the switching time of the contact period and the non-contact period. Parameters for this simulation are as follows:

Direction: 30 degrees; $M_z$: 1 [kg]; $M_a$: 0.1 [kg];

$$C_m: 2 \times 10^{-8} \left[\frac{m}{N}\right]; N: 8\left[\frac{N}{V}\right];$$

g: 9.81 [m/sec$^2$]; $C_x$: $10^{-7}$ [m/N]; $b_z$: $10^4$ [kg/sec]; $b_a$: $3 \times 10^3$ [kg/sec]; $R_v$: 10 [kg/sec]; $\mu$: 0.2; r: 2 [cm]; $r_p$: 2 [cm]; $(x_1, y_1) = (r\cos(0), r\sin(0))$;

$$(x_2, y_2) = \left(r\cos\left(\frac{2\pi}{3}\right), r\sin\left(\frac{2\pi}{3}\right)\right); (x_3, y_3)) = \left(r\cos\left(\frac{4\pi}{3}\right), r\sin(4\pi 3)\right);$$

gap distance between the tip and the bottom surface with zero applied voltages: $10^{-5}$[m]; $e_1(t)=150 \sin(\omega t)$ $$+\cos\left(\frac{\pi}{6}\right)300 \cos(\omega t)\frac{r}{r_p};$$

$e_2(t)=150 \sin(\omega t)$; $e3(t)=150 \sin(\omega t)-$ $$-\cos\left(\frac{\pi}{6}\right)300 \cos(\omega t)\frac{r}{r_p};$$

$\omega=2\pi 1000$ [rad/sec]

Figure 13:
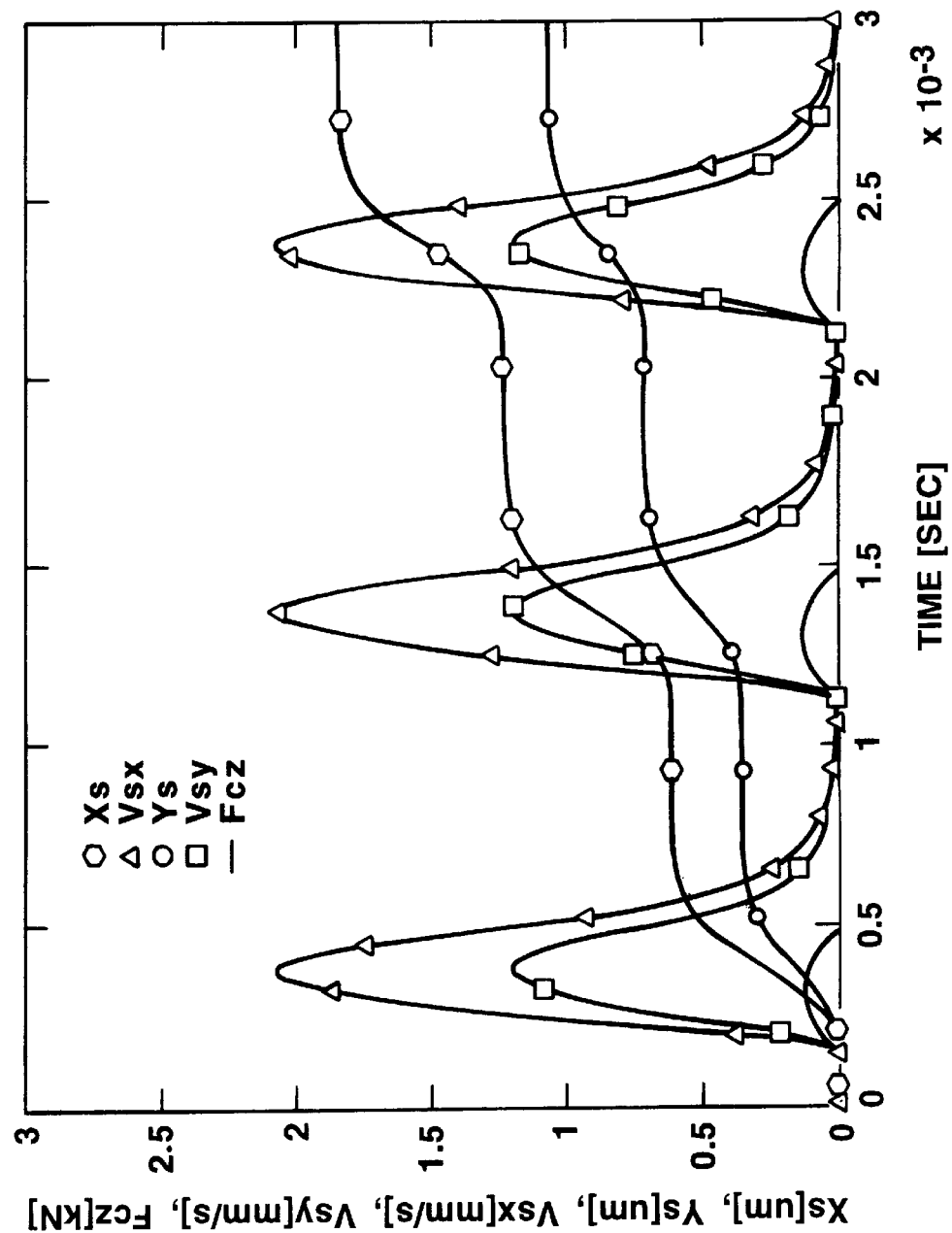
FIG. 13 is a graph illustrating the time response of stage motion of the system of FIG. 11.
Figure 14:
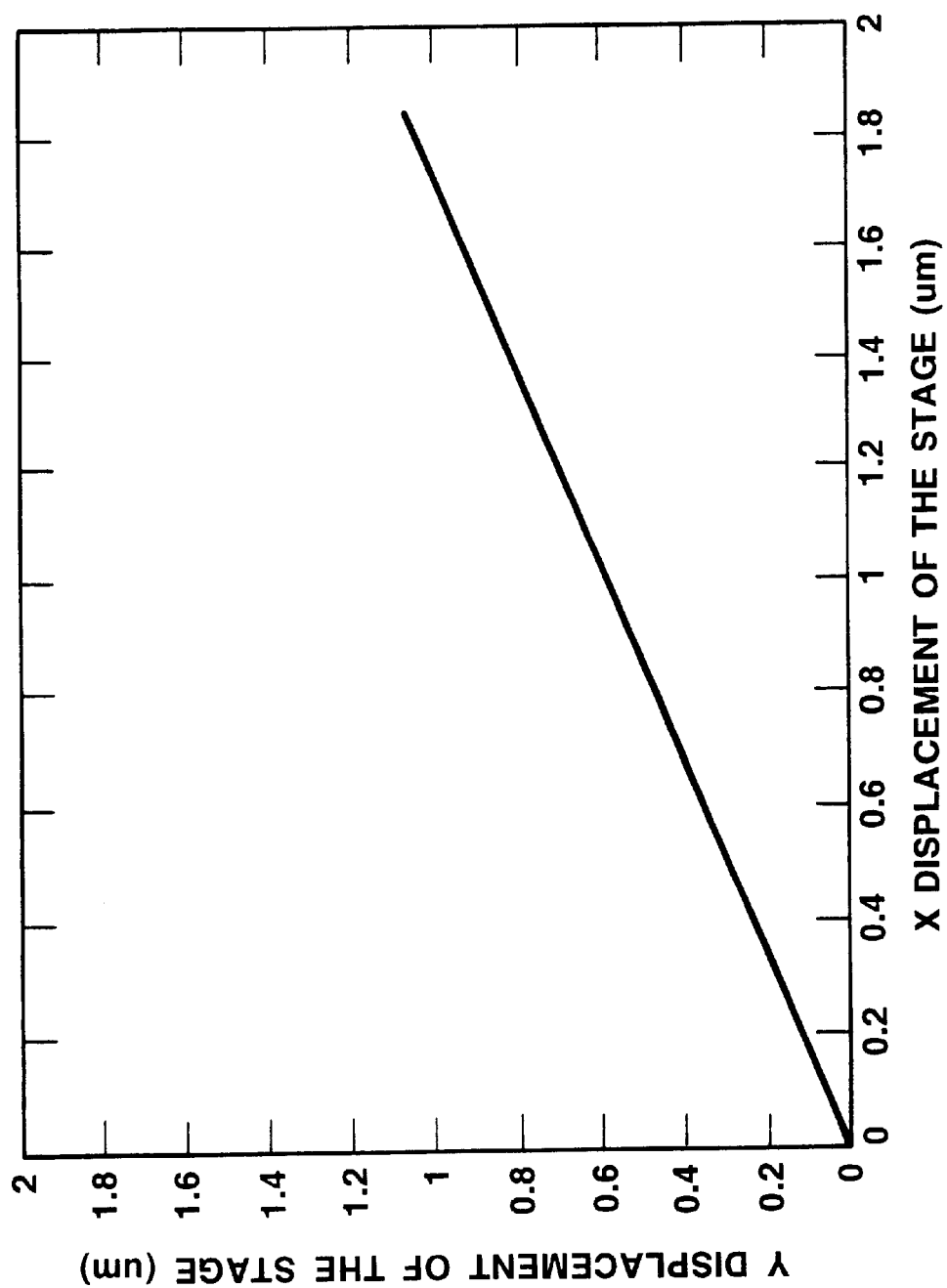
FIG. 14 is a graph illustrating the trajectory of stage motion of the system of FIG. 11.

FIG. 13 shows the time response of the stage motion. The x and y positions of the stage are represented by $X_s$ and $Y_s$, respectively. In this figure, to easily recognize the contact and non contact periods, $F_{cx}$ is also plotted. The time period of positive $F_{ct}$ corresponds to the contact period. As expected, the velocities of both x and y are increased during the contact period, and these are decreased during the non contact period. Note that a high viscous friction resistance in the bearing system is used in this simulation for showing the motion of the stage dramatically. Due to the very high friction resistance of the bearings, the velocity of the stage is reduced to almost zero as expected during the non contact period of every cycle. The time responses show that the velocity and position are consistent. In order to clearly confirm the direction of the simulated motion, the x–y plot is shown separately in FIG. 14. The direction of the simulated stage motion is 30 degrees which is exactly the same as the input to the simulated model.

Figure 15:
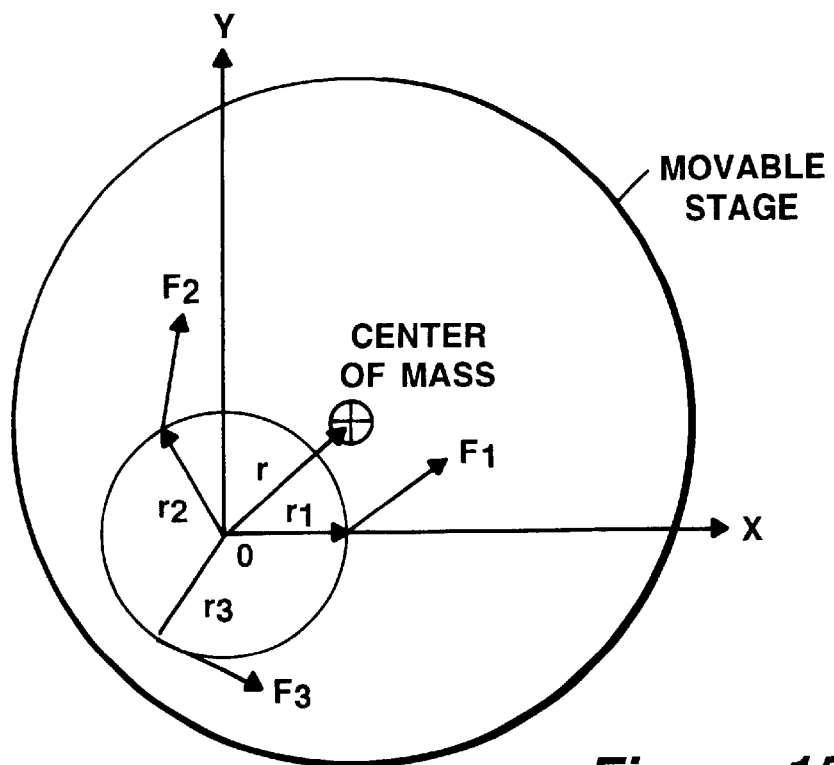
FIG. 15 illustrates the forces and moment on the movable stage by the three actuation systems of FIG. 2.

Referring to FIG. 15, a representation of the forces and moment on the movable stage by three actuation systems (see FIG. 2) is shown for the purpose of confirming the controllability of the system as follows: $M_s$ and I represent the mass and inertia of the movable stage, respectively. X, Y, O represent horizontal, vertical axes, and the center of three actuation systems, respectively. r is a position vector $[x(t), y(t)]^T$ of the center of mass of movable stage with respect to ground or the center of three actuation system locations. And, $\theta(t)$ represents the angle of the movable stage with respect to ground. $r_1=[a_1, b_1]r$, $r_2=[a_2, b_2]T$, $r_3=[a_3, b_3]^T$ represent the constant position vectors of three actuation systems. $F_1=[F_{1x}, F_{1y}]^T$, $F_2=[F_{2x}, F_{2y}]^T$, $F_3=[F_{3x}, F_{3y}]^T$ represent forces acting on the movable stage by actuation system 1, 2, and 3, respectively. Then, the equations of motion of the moveable stage are as follows:

Ms $dx^2(t)/dt^2+b_x$ $dx(t)/dt=F_{1x}+F_{2x}+F_{3x}$, Ms $dy^2(t)/dt^2+b_y$ $dy(t)/dt=F_{1y}+F_{2y}+F_{3y}$, I $d\theta^2(t)/dt^2+b_\theta$ $d\theta(t)/dt=T$, (17)

where T is the z component of T. Since T can be obtained as:

$T=(r_1-r)\times F_1+(r_2-r)\cdot F_2+(r_3-r)\times F_3$, $T=-x(t)\{F_{1y}+F_{2y}+F_{3y}\}+y(t)\{F_{1x}+F_{2x}+F_{3x}\}+\{a_1F_{1y}+a_2F_{26}+a_3F_{3y}\}-\{b_1F_{tx}+b_2F_{2x}+b_3F_{3x}\}$ (18)

Let $x(t)$ be $x_1$, $dx(t)/dt$ be $x_2$, $y(t)$ be $x_3$, $dy(t)/dt$ be $x_4$, $\theta(t)$ be $x_5$, $d\theta(t)/dt$ be $x_6$. Then the equation (17) can be rewritten as a nonlinear state equation as follows:

$$dX/dt=Ax+B(X)y, \quad (19)$$

where $X=[x_1, x_2, x_3, x_4, x_5, x_6]^T$, $u=[F_{1x}, F_{2x}, F_{3x}, F_{1y}, F_{2y}, F_{3y}]^T$, $$A = \begin{bmatrix} 0 & 1 & 0 & 0 & 0 & 0 \\ 0 & e1 & 0 & 0 & 0 & 0 \\ 0 & 0 & 0 & 1 & 0 & 0 \\ 0 & 0 & 0 & e2 & 0 & 0 \\ 0 & 0 & 0 & 0 & 0 & 1 \\ 0 & 0 & 0 & 0 & 0 & e3 \end{bmatrix} \quad (20)$$

where $e1=-b_x/M_x$, $e2=-b_y/M_D$ $e3=-b_\theta/I$, $$B = \begin{bmatrix} 0 & 0 & 0 & 0 & 0 & 0 \\ 1 & 1 & 1 & 0 & 0 & 0 \\ 0 & 0 & 0 & 0 & 0 & 0 \\ 0 & 0 & 0 & 1 & 1 & 1 \\ 0 & 0 & 0 & 0 & 0 & 0 \\ d1 & d2 & d3 & d4 & d5 & d6 \end{bmatrix} \quad (21)$$

where $d1=-b_1+x_3$, $d2=-b_2+x_3$, $d3=-b_3+x_3$, $d4=a_1-x_1$, $d5=a_2-x_1$, $d6=a_3-x_1$.

Here, let us define a 3×6 matrix E, which is composed of nonzero rows of B.

$$E = \begin{bmatrix} 1 & 1 & 1 & 0 & 0 & 0 \\ 0 & 0 & 0 & 1 & 1 & 1 \\ d1 & d2 & d3 & d4 & d5 & d6 \end{bmatrix} \quad (22)$$

Unless $d1=d2=d3$ and $d4=d5=d6$, the rank of E is 3. Here, $d1=d2=d3$ means that three actuation systems have the same Y locations, and $d4=d5=d6$ means that three actuation systems have the same X locations, physically. Thus, there exists a pseudo-inverse matrix of E, F. And, matrix F satisfies the following relation.

$$EF=I_3, \quad (23)$$

where $I_3$ is 3×3 identity matrix.

Here, note that F is not unique. Now, consider a nonlinear feedback controller to linearize the system having equations of motion given by equation (17) as follows:

$$u=Fv, \quad (24)$$

where v is a new control input vector, $$v=[v_1, v_2, v_3]^T. \quad (25)$$

Then, the system can be linearized as follows:

$$dX/dt=AX+B(X)u=AX+\{B(X)F\}v \quad (26)$$

where $$BF = \begin{bmatrix} 0 & 0 & 0 \\ 1 & 0 & 0 \\ 0 & 0 & 0 \\ 0 & 1 & 0 \\ 0 & 0 & 0 \\ 0 & 0 & 1 \end{bmatrix}$$

From Equation (26), note that three state variables, $x(t)$, $y(t)$, $\theta(t)$ are decoupled. For each de-coupled subsystem, it is obvious that controllability matrix has the rank of two, and observability matrix has the rank of two if it is assumed that the system output is the position (and velocity) of the system. Therefore, the linearized system is controllable and observable for each de-coupled subsystem. Now, consider matrix F, which satisfies Equation (23). As mentioned previously, F is not unique. But here is one choice. $F=E^T(EE^T)^{-1}$. Then, $EF=I_3$. And F always exists unless d1=d2=d3 and d4=d5=d6. Now, new control input to the system U can be rewritten as u=Fv. In the system shown in FIG. 2, u can practically be determined by both the amplitude of elliptical locus and the rotation of the plane of the elliptical locus for each actuation system. Therefore, the system shown in FIG. 2 can be said controllable and observable.

Figure 16:
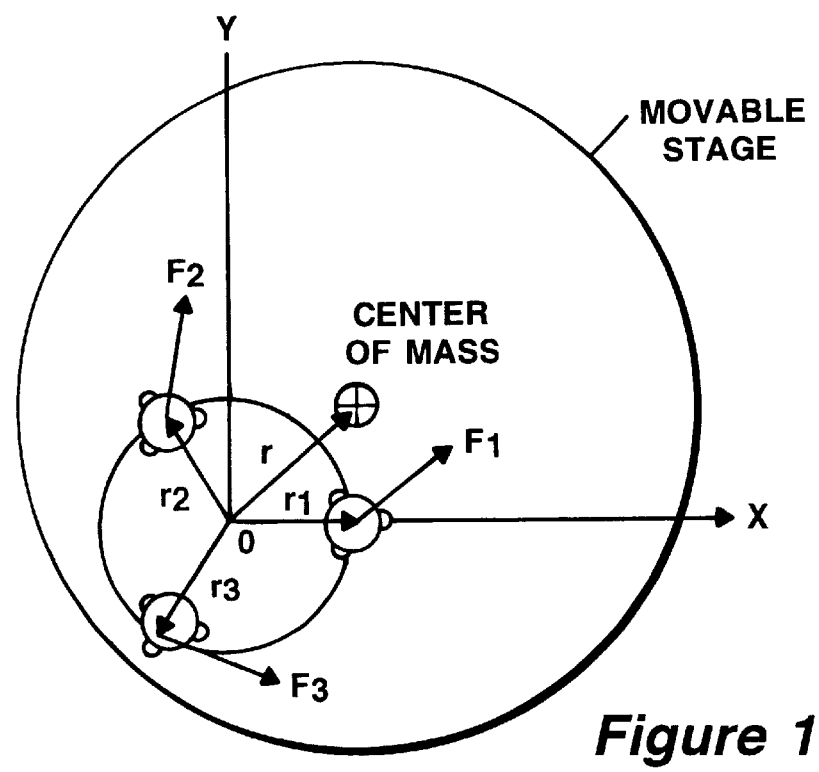
FIG. 16 illustrates the position of three actuation systems relative to the stage for purposes of simulating the three degree of freedom motion of the stage.

Simulation of the three degree of freedom motion of the stage of FIG. 2 is illustrated with reference to FIG. 16, which shows the locations of the three actuation systems relative to the stage. Electrical voltages are applied to each piezoelectric element. Since each actuation system includes 3 actuation systems as shown above in this system configuration, 9 voltage signals are needed. The equations of motion of the whole system are as follows:

$$M_s \frac{dv_{sx}}{dt} = -b_s v_{sx} + f_{x1} + f_{x2} + f_{x3}, \quad (27)$$

$$M_s \frac{dv_{sy}}{dt} = -b_s v_{sy} + f_{y1} + f_{y2} + f_{y3}, \quad (28)$$

$$I \frac{dv_{s\theta}}{dt} = -b_\theta v_{s0} + T, \quad (29)$$

$M_s$: mass of the stage, I: inertia of the stage, $v_{sx}$, $v_{sy}$, $v_{sq}$: x, y, $\theta$-component of stage velocity, $b_a$: viscous resistance of bearing, $f_{xi}$, $f_{yi}$: x, y-component of force by the $i^{th}$ actuation system, T: moment by three actuation systems.

$$\frac{1}{k_z} \frac{dF_{cz1}}{dt} = v_{az1}, \frac{1}{k_z} \frac{dF_{cz2}}{dt} = v_{az2}, \frac{1}{k_z} \frac{dF_{cz3}}{dt} = v_{az3}, \quad (30,31,32)$$

$k_z$: z-directional stiffness of fiction material, $F_{czi}$: z-directional compliant force in friction material by the $i^{th}$ actuation system, $v_{azi}$: z-component of the actuator velocity by the $i^{th}$ actuation system.

$$M_a \frac{dv_{11}}{dt} = -F_{cm11} - b_a v_{11} + Ne_{11}(t) - F_{11} \quad (33)$$

$$M_a \frac{dv_{21}}{dt} = -F_{cm21} - b_a v_{21} + Ne_{21}(t) - F_{21} \quad (34)$$

$$M_a \frac{dv_{31}}{dt} = -F_{cm31} - b_a v_{31} + Ne_{31}(t) - F_{31} \quad (35)$$

$$M_a \frac{dv_{12}}{dt} = -F_{cm12} - b_a v_{12} + Ne_{12}(t) - F_{12} \quad (36)$$

$$M_a \frac{dv_{22}}{dt} = -F_{cm22} - b_a v_{22} + Ne_{22}(t) - F_{22} \quad (37)$$

$$M_a \frac{dv_{32}}{dt} = -F_{cm32} - b_a v_{32} + Ne_{32}(t) - F_{32} \quad (38)$$

$$M_a \frac{dv_{13}}{dt} = -F_{cm13} - b_a v_{13} + Ne_{13}(t) - F_{13} \quad (39)$$

$$M_a \frac{dv_{23}}{dt} = -F_{cm23} - b_a v_{23} + Ne_{23}(t) - F_{23} \quad (40)$$

$$M_a \frac{dv_{33}}{dt} = -F_{cm33} - b_a v_{33} + Ne_{33}(t) - F_{33} \quad (41)$$

$M_a$: actuator mass, $v_{ij}$: z-component of the $i^{th}$ piezoelectric element of the $j^{th}$ actuation system, $F_{craij}$: mechanical compliant force in the $i^{th}$ piezoelectric element of the $j^{th}$ actuation system, $e_{ij}$ represents the voltage input to the $i^{th}$ piezoelectric element of the $j^{th}$ actuation system, $F_{ij}$: z-component of the force by the $i^{th}$ piezoelectric element of the $j^{th}$ actuation system, N: transformer modulus in piezoelectric element.

$$\frac{1}{k_m} \frac{dF_{cm11}}{dt} = v_{11}, \frac{1}{k_m} \frac{dF_{cm21}}{dt} = v_{21}, \frac{1}{k_m} \frac{dF_{cm31}}{dt} = v_{31} \quad (42,43,44)$$

$$\frac{1}{k_m} \frac{dF_{cm12}}{dt} = v_{12}, \frac{1}{k_m} \frac{dF_{cm22}}{dt} = v_{22}, \frac{1}{k_m} \frac{dF_{cm32}}{dt} = v_{32} \quad (45,46,47)$$

$$\frac{1}{k_m} \frac{dF_{cm13}}{dt} = v_{13}, \frac{1}{k_m} \frac{dF_{cm23}}{dt} = v_{23}, \frac{1}{k_m} \frac{dF_{33}}{dt} = v_{33} \quad (48,49,50)$$

$$\frac{dx_s}{dt} = v_{sx}, \frac{dy_s}{dt} = v_{sy}, \frac{d\theta_\theta}{dt} = v_{s\theta}, \quad (51,52,53)$$

$k_m$: mechanical stiffness in a piezoelectric element, $x_s$, $y_s$, $\theta_S$, x, y, $\theta$-component of stage velocity. Equations (27) to (53) are state equations for 3 degrees of freedom friction drive stage. The following equations are supplemental equations to support state equations (27) to (53):

$$f_{x1} = \mu \frac{(v_{ax1} - v_{sx1}) f_{cz1}}{\sqrt{(v_{ax1} - v_{sx1})^2 + (v_{ay1} - v_{sy1})^2}} + R_x(v_{ax1} - v_{sx1})$$

$$f_{x2} = \mu \frac{(v_{ax2} - v_{sx2}) f_{cz2}}{\sqrt{(v_{ax2} - v_{sx2})^2 + (v_{ay2} - v_{sy2})^2}} + R_x(v_{ax2} - v_{sx2})$$

$$f_{x3} = \mu \frac{(v_{ax3} - v_{sx3}) f_{cz3}}{\sqrt{(v_{ax3} - v_{sx3})^2 + (v_{ay3} - v_{sy3})^2}} + R_x(v_{ax3} - v_{sx3})$$

$$f_{y1} = \mu \frac{(v_{ay1} - v_{sy1}) f_{cz1}}{\sqrt{(v_{ax1} - v_{sx1})^2 + (v_{ay1} - v_{sy1})^2}} + R_y(v_{ay1} - v_{sy1})$$

$$f_{y2} = \mu \frac{(v_{ay2} - v_{sy2}) f_{cz2}}{\sqrt{(v_{ax2} - v_{sx2})^2 + (v_{ay2} - v_{sy2})^2}} + R_x(v_{ay2} - v_{sy2})$$

$$f_{y3} = \mu \frac{(v_{ay3} - v_{sy3}) f_{cz1}}{\sqrt{(v_{ax3} - v_{sx3})^2 + (v_{ay3} - v_{sy3})^2}} + R_x(v_{ay3} - v_{sy3})$$

$f_{xi}$, $f_{yi}$: x and y components of the force acting on the stage by the $i^{th}$ actuation system.

$v_{sx1}=v_{sx}-b_1 v_\theta$, $v_{sx2}=v_{sx}-b_2 v_\theta$, $v_{sx3}=v_{sc}-b_3 v_{74}$ $v_{sy1}=v_{sy}+\alpha_1 v_{74}$, $v_{sy2}=v_{sy}+\alpha_2 v_\theta$, $v_{sy3}=v_{sy}+\alpha_3 v_{74}$ $v_{sxi} v_{syi}$: x and y components of the stage velocity at the center of the $i^{th}$ actuation system, $(a_1,b_1)$, $(a_2,b_2)$, and $(a_3, b_3)$: x and y positions of the three actuation systems.

$v_{ax1}=J_{11}v_{11}+J_{12}v_{12}+J_{13}v_{31}$, $v_{ax2}=J_{11}v_{12}+J_{12}v_{22}+J_{13}v_{32}$, $v_{ax3}=J_{11}v_{13}+J_{12}v_{23}+J_{13}v_{33}$.

$v_{ay1}=J_{21}v_{11}+J_{22}v_{21}+J_{23}v_3$, $v_{ay2}=J_{21}v_{12}+J_{22}v_{22}+J_{23}v_{32}$, $v_{ay3}=J_{21}v_{13}+J_{22}v_{23}+J_{23}v_{33}$ $v_{ax1}=J_{31}v_{11}+J_{32}v_{21}+J_{33}v_3$, $v_{ax2}=J_{31}v_{12}+J_{32}v_{22}+J_{33}v_{32}$, $v_{ax3}=J_{31}v_{13}J_{32}v_{32}+J_{33}v_{33}$ $v_{axi}$, $v_{ayi}$: x and y components of the velocity of the tip of the $i^{th}$ actuation system, $J_{ij}$: elements of Jacobian matrix.

$F_{11}=J_{11}f_{x1}+J_{21}f_{y1}+J_{31}f_{za}$, $F_{21}=J_{12}f_{x1}+J_{22}f_{y1}+J_{32}f_{x1}$, $F_{31}=J_{13}f_{x1}+J_{12}f_{y1}+J_{33}f_{xi}$ $F_{12}=J_{11}f_{x2}+J_{21}f_{y2}+J_{31}f_{x2}$, $F_{22}=J_{12}f_{x2}+J_{22}f_{y2}+J_{32}f_{x2}$. $F_{32}J_{13}f_{x2}+J_{23}f_{y2}+J_{33}f_{x2}$.

$F_{13}=J_{11}f_{x3}+J_{21}f_{y3}+J_{31}f_{x3}$, $F_{23}=J_{12}f_{x3}+J_{22}f_{y3}+J_{32}f_{x3}$, $F_{33}=J_{13}f_{x3}+J_{23}f_{y3}+J_{33}f_{x3}$ $T=-x_s(f_{y1}+f_{y2}+f_{y3})+y_s(f_{x1}+f_{x3}+f_{x3})+(a_1 f_{y1}+a_2 f_{y2}+a_3 f_{y3})-(b_1 f_{x1}+b_2 f_{x2}+b_3 f_{x3})$.

Figure 17:
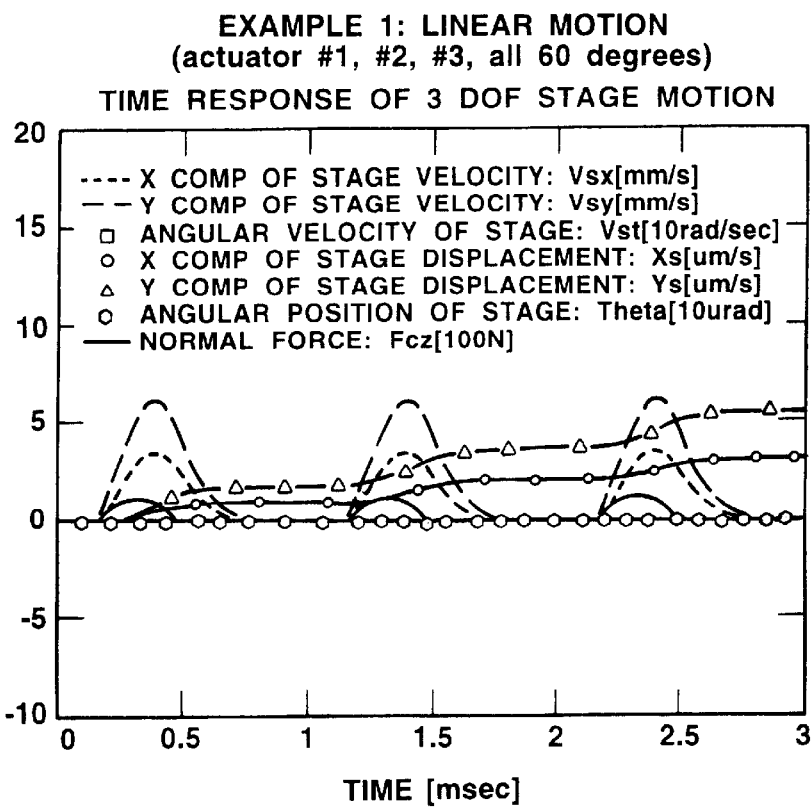
FIG. 17 shows an illustrative time response of the stage motion in order to achieve linear stage motion.
Figure 17A:
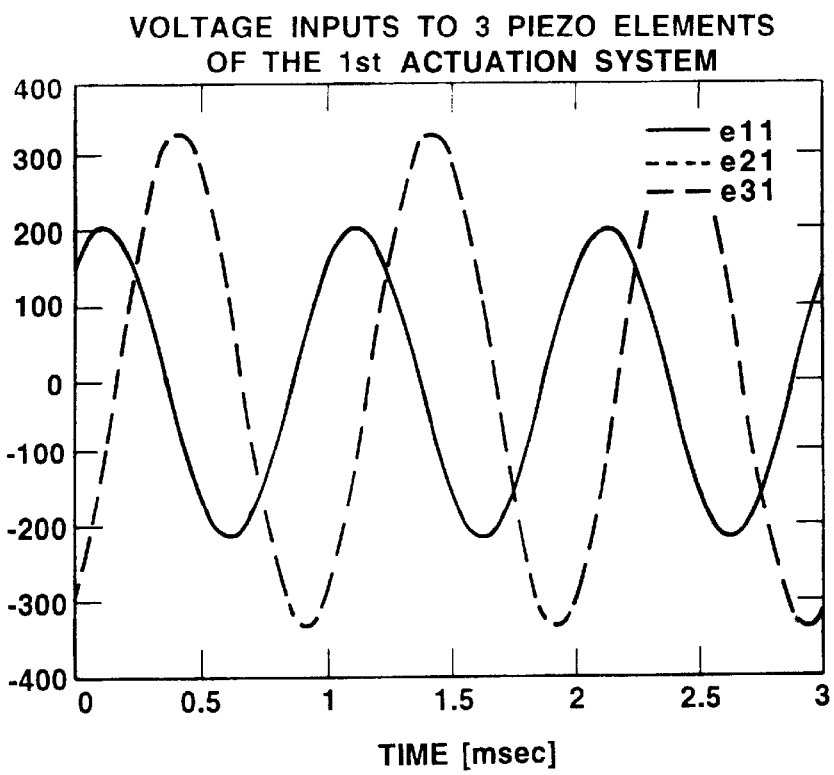
FIGS. 17A–17C show the voltage excitation signals for the three elongated actuation members of the first, second and third actuation systems, respectively, to achieve the time response of FIG. 17.
Figure 17B:
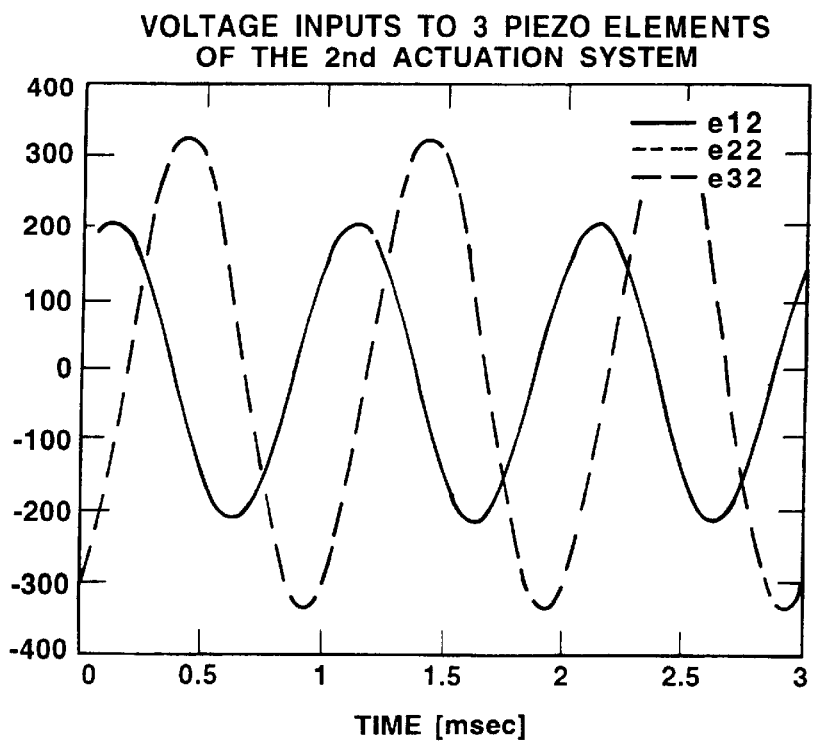
Figure 17C:
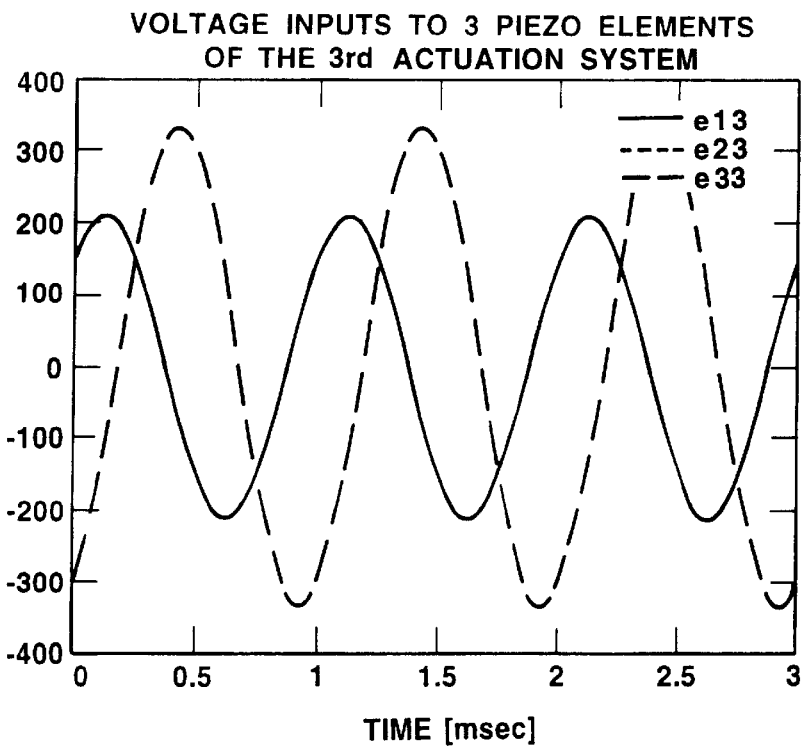
Figure 17D:
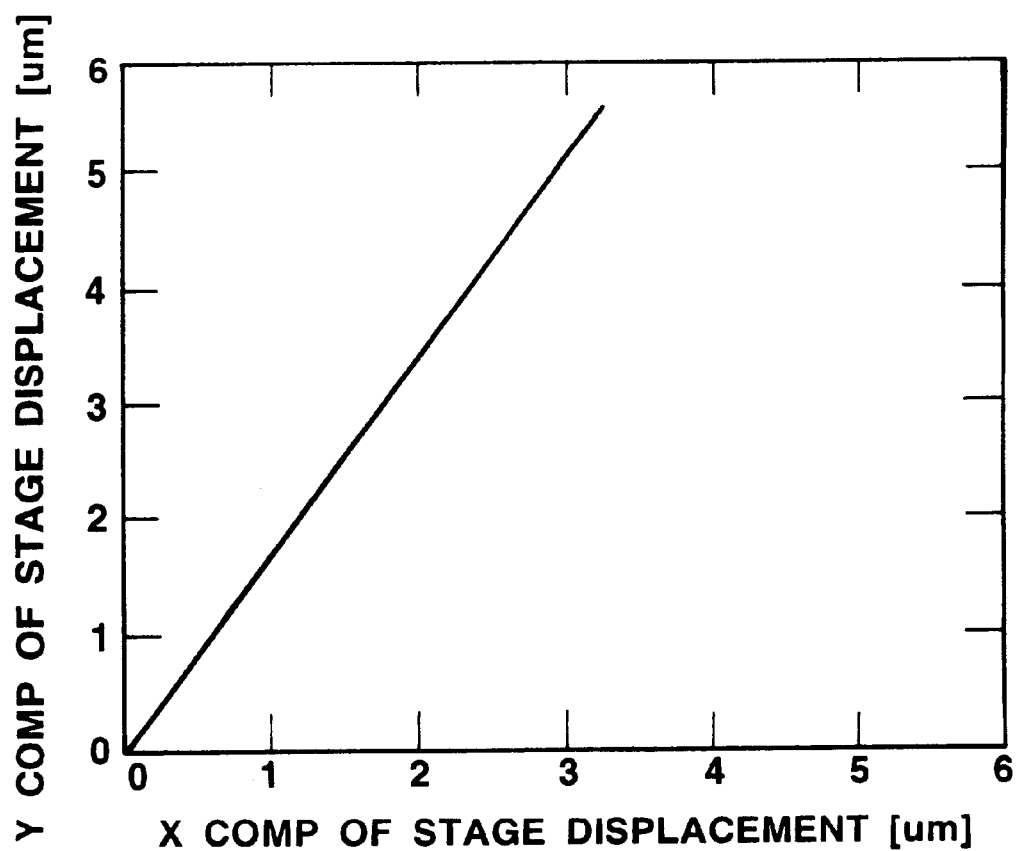
FIG. 17D shows the displacement of the stage in response to the excitation signals of FIGS. 17A–17C.

Three examples of stage motion are illustrated in FIGS. 17–19D. In particular, FIG. 17 shows an illustrative time response of the stage motion in order to achieve linear stage motion. Note that the waveform of the angular velocity of the stage overlaps the waveform of the angular position of the stage along the zero horizontal axis. FIGS. 17A–17C show the voltage excitation signals for the three elongated actuation members of the first, second and third actuation systems, respectively, to achieve the time response of FIG. 17. Note that voltage input signals e11=e21, e12=e22, and e13=e23. FIG. 17D shows the resulting displacement of the stage in response to the excitation signals of FIGS. 17A–17C.

Figure 18:
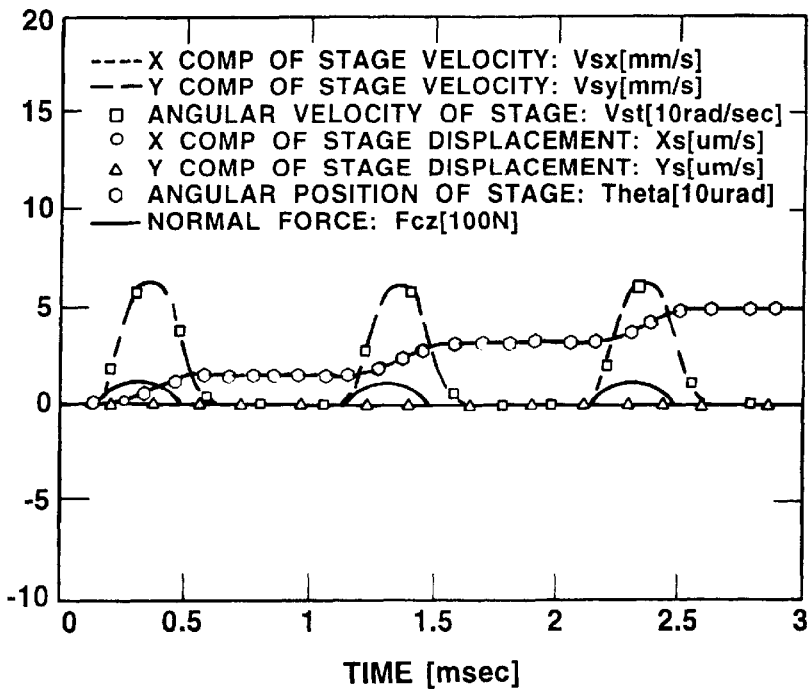
FIG. 18 shows another illustrative time response of the stage motion in order to achieve rotational stage motion.
Figure 18A:
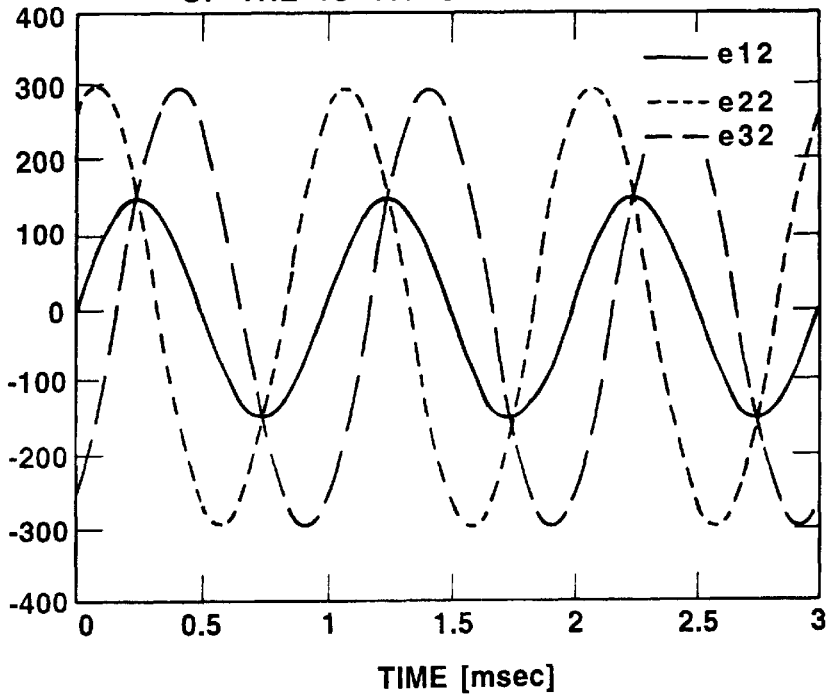
FIGS. 18A–18C show the voltage excitation signals for the three elongated actuation members of the first, second and third actuation systems, respectively, to achieve the time response of FIG. 18.
Figure 18B:
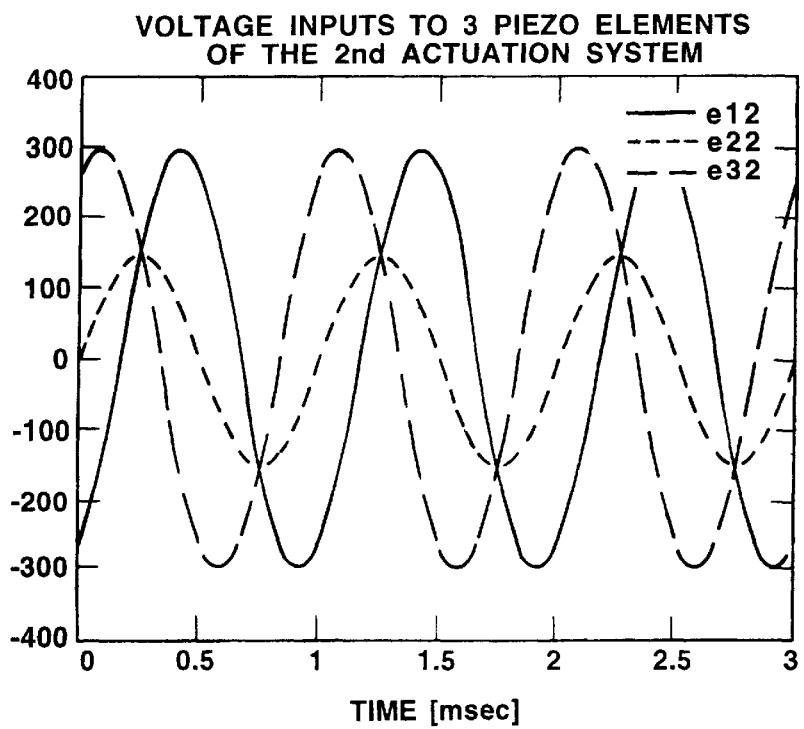
Figure 18C:
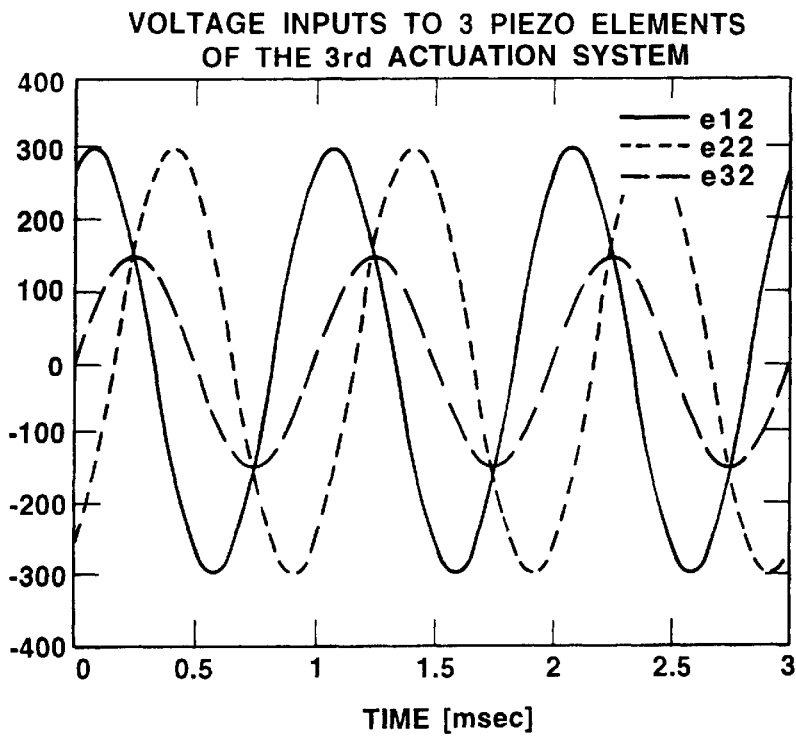
Figure 18D:
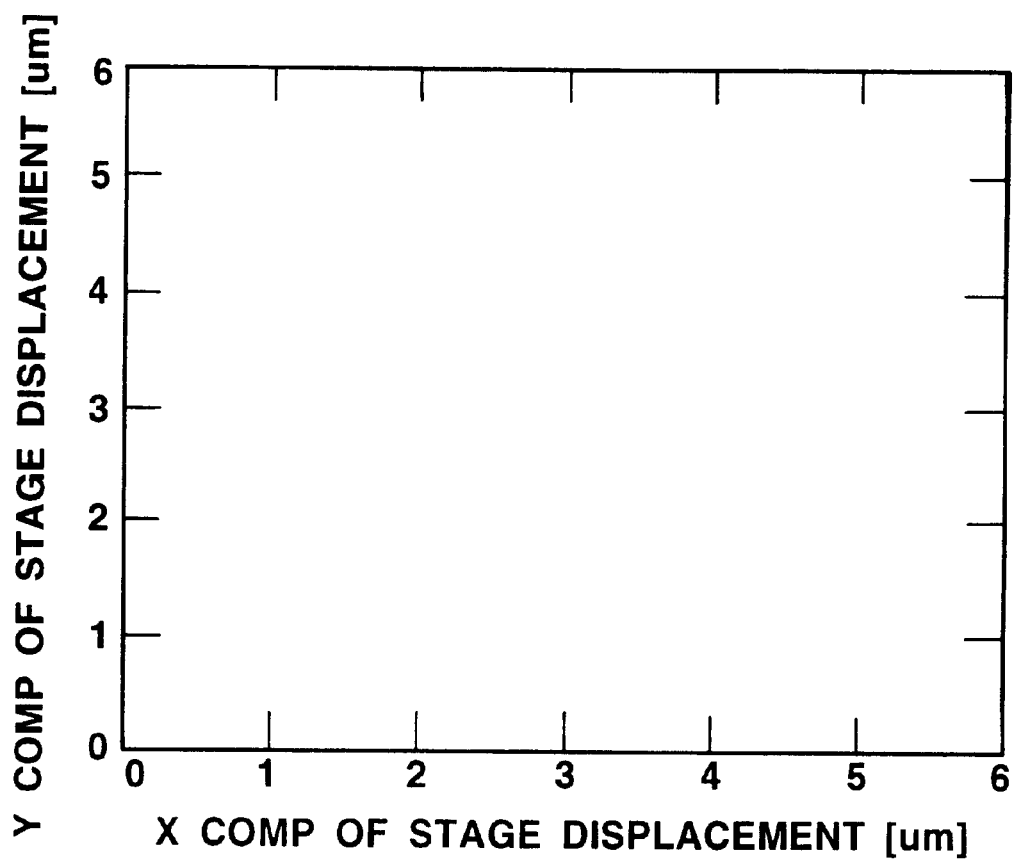
FIG. 18D shows the displacement of the stage in response to the excitation signals of FIGS. 18A–18C.

FIG. 18 shows an illustrative time response of the stage motion in order to achieve rotational stage motion. Note that the velocity in the X and Y directions are zero. FIGS. 18A–18C show the voltage excitation signals for the three elongated actuation members of the first, second and third actuation systems, respectively, to achieve the time response of FIG. 18 and FIG. 18D shows the resulting displacement of the stage in response to the excitation signals of FIGS. 18A–18C. Note that the X and Y displacements are zero.

Figure 19:
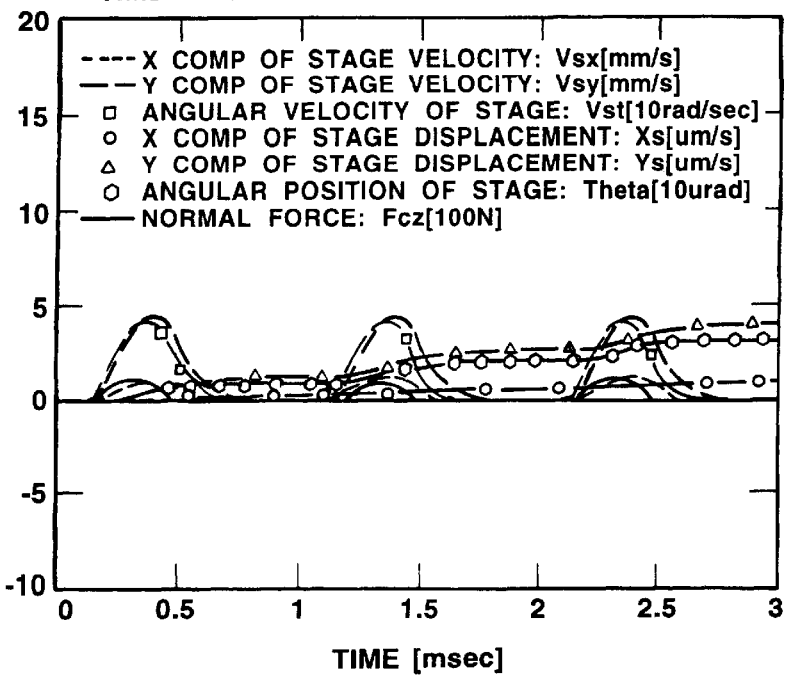
FIG. 19 shows a further illustrative time response of the stage motion to achieve linear and rotational motion.
Figure 19A:
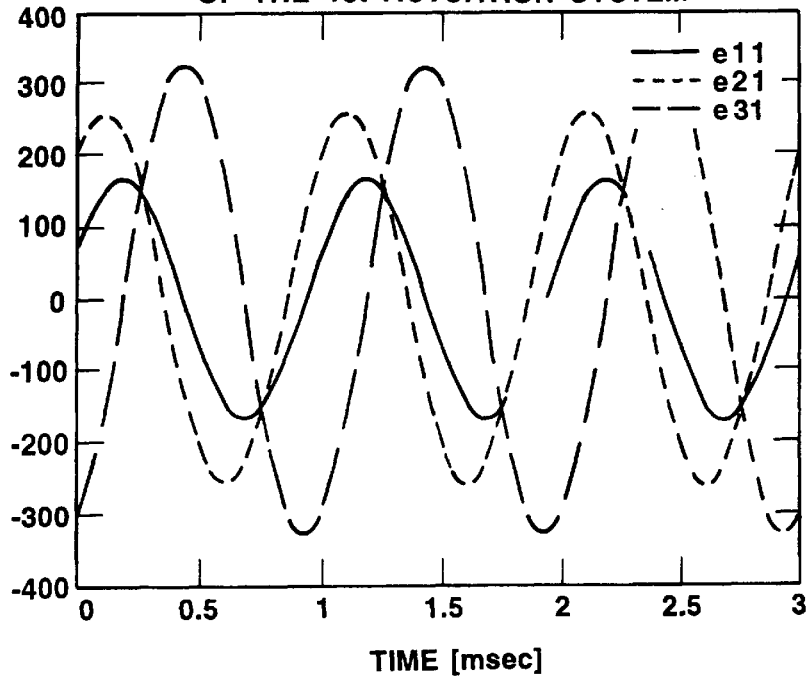
FIGS. 19A–19C show the voltage excitation signals for the three elongated actuation members of the first, second and third actuation systems, respectively, to achieve the time response of FIG. 19.
Figure 19B:
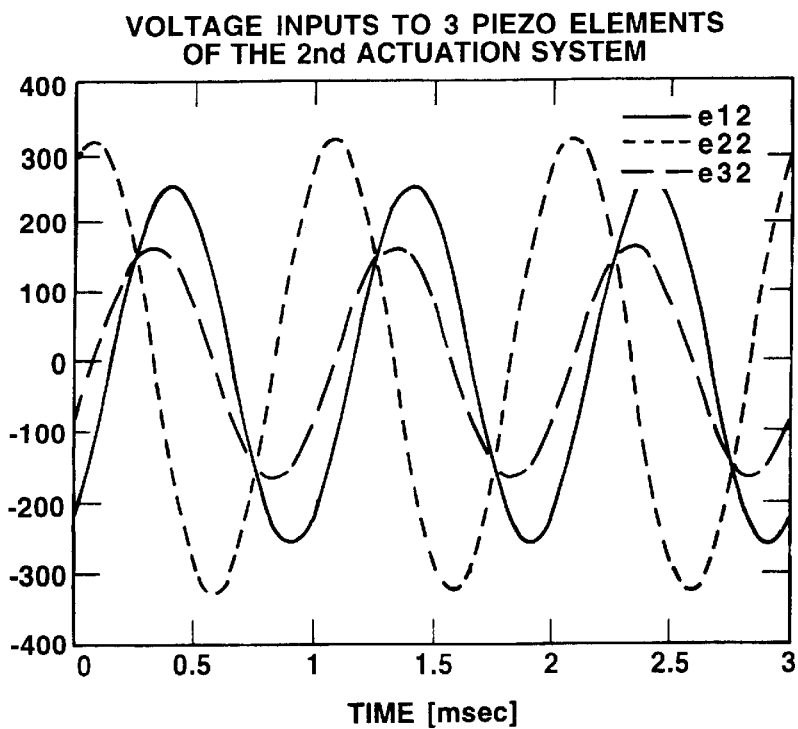
Figure 19C:
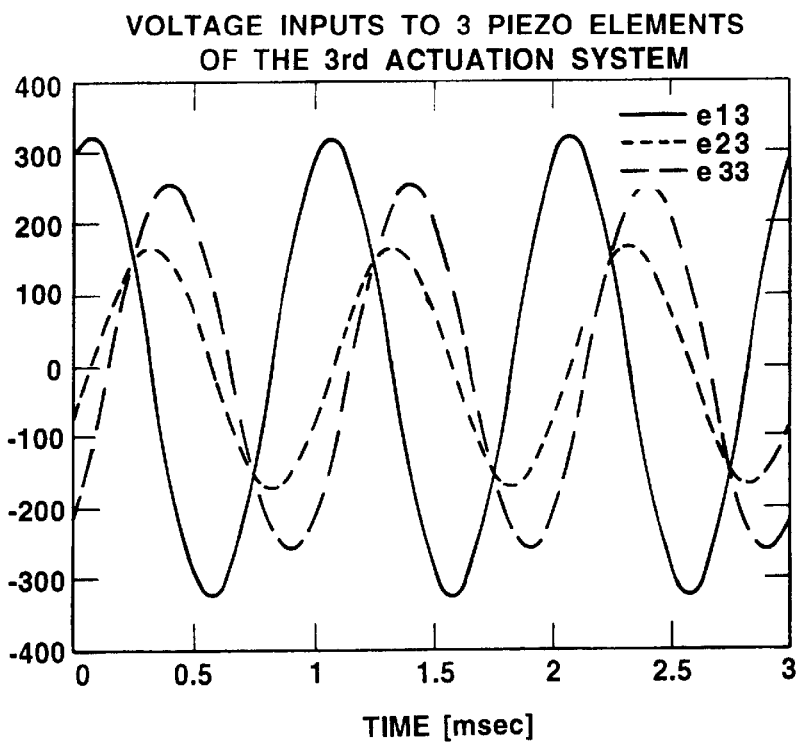
Figure 19D:
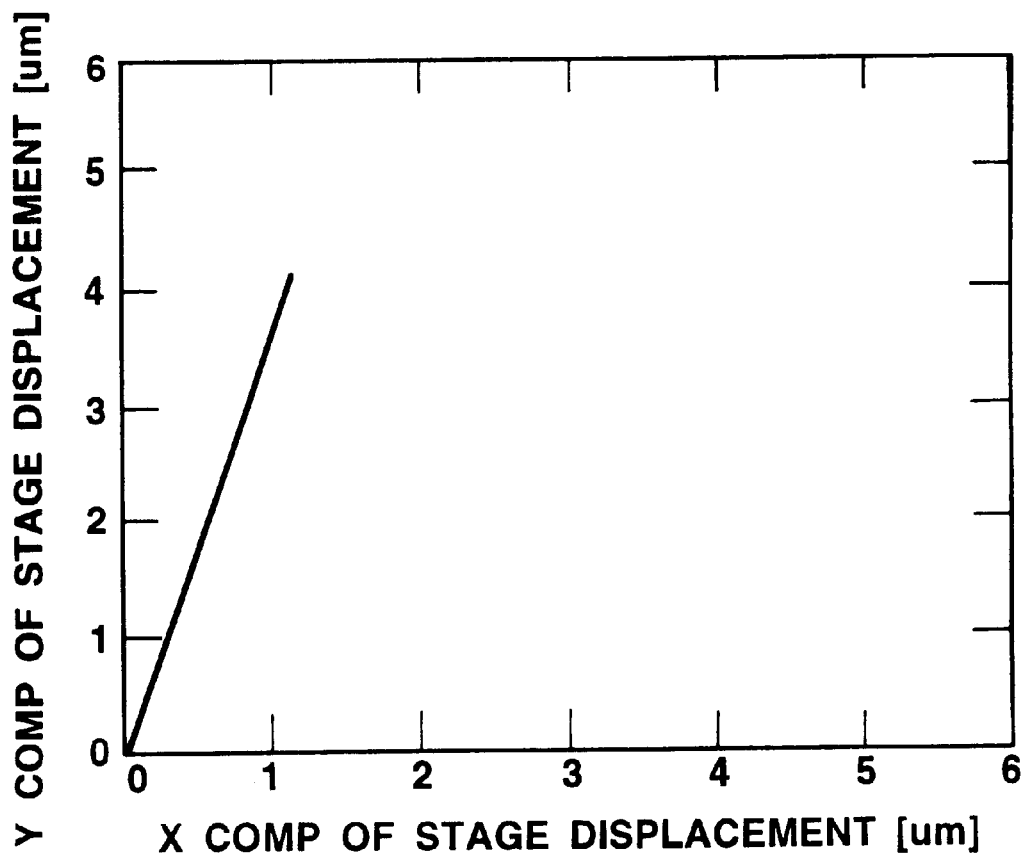
FIG. 19D shows the displacement of the stage in response to the excitation signals of FIGS. 19A–19C.

FIG. 19 shows a further illustrative time response of the stage motion to achieve linear and rotational motion. FIGS. 19A–19C show the voltage excitation signals for the three elongated actuation members of the first, second and third actuation systems, respectively, to achieve the time response of FIG. 19 and FIG. 19D shows the resulting displacement of the stage in response to the excitation signals of FIGS. 19A–19C.

FIGS. 20–20D contain Matlab simulation code used for simulating the three degree of motion movement of the stage in response to the signals of FIGS. 17–17D, 18–18D, and 19–19D.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A friction drive positioning stage system, comprising:
    a substantially planar stage; and
    a plurality of actuation systems, each having a tip in contact with a surface of said stage, said tip being movable in an elliptical path disposed in a plane substantially orthogonal to the plane of the stage, wherein said plane of said elliptical path is rotatable.

2. The system of claim 1 wherein said plurality of actuation systems are operable to move said stage in X, Y, and θ.

3. The system of claim 1 wherein the elliptical path of each of said plurality of actuation systems is independently controllable.

4. The system of claim 1 wherein each of said plurality of actuation systems comprises:
    a plurality of elongated actuation members, and
    a substantially rigid hat element attached to an end of each of said plurality of elongated actuation members and having a rounded portion at which said tip is disposed.

5. The system of claim 4 wherein each of said plurality of elongated actuation members is spaced from the other ones of said plurality of elongated actuation members.

6. The system of claim 5 wherein each of said plurality of elongated actuation members is comprised of a piezoelectric material.

7. The system of claim 6 wherein each of said plurality of elongated actuation members comprises a plurality of stacked piezoelectric elements.

8. The system of claim 1 wherein said friction drive positioning stage system comprises three actuation systems.

9. An actuation system for a friction drive positioning stage system, comprising:
    a plurality of elongated actuation members; and
    a substantially rigid hat element attached to an end of each of said plurality of elongated actuation members and having a rounded portion at which a tip of said actuation system is disposed, wherein each of said plurality of elongated actuation members is spaced from the other ones of said plurality of elongated actuation members.

10. The system of claim 9 wherein each of said plurality of elongated actuation members comprises a piezoelectric material.

11. The system of claim 10 wherein each of said plurality of elongated actuation members comprises a plurality of stacked piezoelectric elements.

12. A method for moving a stage having a substantially planar surface in two dimensions and for rotating the stage, comprising the steps of:
    providing a plurality of actuation systems, each one having a tip for contacting the planar surface and being movable in an elliptical path disposed in a rotatable plane substantially orthogonal to the plane of the stage; and
    independently controlling the angle of the plane of the elliptical path in which the tip of each of the plurality of actuation systems is movable.

13. The method of claim 12 wherein the actuating system providing step comprises the steps of:
    providing a plurality of elongated actuation members; and
    attaching a substantially rigid hat element to an end of each of said plurality of elongated actuation members, said hat element having a rounded portion at which the tip of the respective actuation system is provided.

14. The method of claim 13 wherein the actuation system providing step further comprises the step of spacing each of the plurality of elongated actuation members from one another.

15. The method of claim 13 wherein the actuation system providing step comprises the step of providing each of said plurality of elongated actuation members with a piezoelectric material.

* * * * *

UNITED STATES PATENT AND TRADEMARK OFFICE
CERTIFICATE OF CORRECTION

PATENT NO.   : 6,457,864 B1
DATED        : October 1, 2002
INVENTOR(S)  : Woo Sok Chang et al.

It is certified that error appears in the above-identified patent and that said Letters Patent is hereby corrected as shown below:

Column 1,
Line 57, delete "of Ultrasonic" and replace with -- of IEEE Ultrasonic --.

Column 2,
Line 13, delete "TEEE" and replace with -- IEEE --.

Column 8,
Line 2, delete "System" and replace with -- system --.
Line 9, delete ",$P_z$]," and replace with -- ,$p_z$], --.
Line 26, delete "$r_p$" and replace with -- where $r_p$ --.

Column 9,
Line 45, delete "$M_z$" and replace with -- $M_s$ --.
Line 46, delete "b," and replace with -- $^b{}_s$, --.
Line 49, delete "$M_g$" and replace with -- $M_s g$ --.
Line 50, delete ",p" and replace with -- ;µ --.

Column 10,
Line 3, delete "$F_{cx}$" and replace with -- $F_{cz}$ --.
Line 43, delete "=$F_{cx}$" and replace with -- =$F_{cz}$ --.
Line 59, delete "$M_z$:" and replace with -- $M_s$: --.
Line 63, delete "$c_m$:" and replace with -- $C_m$: --.
Line 65, delete "$C_x$:" and replace with -- $C_z$: --.
Line 65, delete "$b_z$;" and replace with -- $b_s$; --.

Column 11,
Line 18, delete "/sec]" and replace with -- /sec]. --.
Line 22, delete "$F_{cx}$" and replace with -- $F_{cz}$ --.
Line 23, delete "$F_{ct}$" and replace with -- $F_{cz}$ --.
Line 47, delete "$b_1$]r," and replace with -- $b_1]^T$, --.
Line 47, delete "$b_2$]T," and replace with -- $b_2]^T$, --.
Line 57, delete "r)'$F_2$" and replace with -- r)x$F_2$ --.
Line 60, delete "{b,$F_{tx}$" and replace with -- {$b_1 F_{1x}$ --.
Line 65, delete "B(X)y;" and replace with -- B(X)u; --.

Column 12,
Line 10, delete "/$M_x$," and replace with -- /$M_s$, --.
Line 64, delete "that controllability" and replace with -- that the controllability --.
Line 65, delete "and observability" and replace with -- and the observability --.

UNITED STATES PATENT AND TRADEMARK OFFICE
CERTIFICATE OF CORRECTION

PATENT NO. : 6,457,864 B1
DATED : October 1, 2002
INVENTOR(S) : Woo Sok Chang et al.

It is certified that error appears in the above-identified patent and that said Letters Patent is hereby corrected as shown below:

Column 13,
Line 5, delete "U" and replace with -- u --.
Lines 15-16, delete "3 actuation" and replace with -- three actuation --.
Lines 16-17, delete "9 voltage" and replace with -- nine voltage --.
Line 29, delete "$b_a$:" and replace with -- $b_s$: --.
Line 37, delete "fiction" and replace with -- friction --.
Line 65, delete "$F_{craij}$;" and replace with -- $F_{cmij}$; --.

Column 14,
Line 17, delete "$\theta$" replace with -- $\theta$:$_s$ --.
Line 43, delete "=$V_{sc}$-$b_3v_{74}$" and replace with -- =$V_{sx}$-$b_3V_\theta$ --.
Line 44, delete "+$\lambda_1,V_{74}$," and replace with -- +$\lambda_1 V_\theta$ --.
Line 44, delete "+$a_3V_{74}$" and replace with -- +$\lambda_3 V_\theta$ --.
Line 50, delete "+$J_{23}V_3$" and replace with -- $J_{23}V_{31}$ --.
Line 52, delete "$V_{ax1}$=" and replace with -- $V_{az1}$= --.
Line 52, delete "$J_{33}V_3$" and replace with -- $J_{33}V_{31}$ --.
Line 52, delete "$V_{ax2}$=" and replace with -- $V_{aZ2}$= --.
Line 56, delete "$f_{za}$'" and replace with -- $f_{z1}$' --.
Line 56, delete "$f_{x1}$'" and replace with -- $f_{z1}$' --.
Line 57, delete "+$J_{12}f_{y1}$" and replace with -- +$J_{23}f_{y1}$ --.
Line 57, delete "+$J_{33}f_{xi}$" and replace with -- +$J_{33}f_{z1}$ --.
Line 58, delete "$J_{31}f_{x2}$," and replace with -- $J_{31}f_{z2}$, --.
Line 58, delete "$J_{32}f_{x2}$," and replace with -- $J_{32}f_{z2}$, --.
Line 59, delete "$F_{32}J_{13}$" and replace with -- $F_{32}$=$J_{13}$ --.
Line 59, delete "$J_{33}f_{x2}$" and replace with -- $J_{33}f_{z2}$ --.
Line 60, delete "$J_{31}f_{x3}$" and replace with -- $J_{31}f_{z3}$ --.
Line 60, delete "$J_{32}f_{x3}$" and replace with -- $J_{32}f_{z3}$ --.
Line 61, delete "$J_{33}f_{x3}$" and replace with -- $J_{33}f_{z3}$ --.
Line 62, delete "($f_{x1}$+$f_{x3}$+$f_{x3}$) and replace with -- ($f_{x1}$+$f_{x2}$+$f_{x3}$) --.

UNITED STATES PATENT AND TRADEMARK OFFICE
CERTIFICATE OF CORRECTION

PATENT NO. : 6,457,864 B1
DATED : October 1, 2002
INVENTOR(S) : Woo Sok Chang et al.

It is certified that error appears in the above-identified patent and that said Letters Patent is hereby corrected as shown below:

Column 15,
Line 28, delete "degree" and replace with -- degrees --.

Signed and Sealed this

Fourteenth Day of October, 2003

JAMES E. ROGAN
*Director of the United States Patent and Trademark Office*